(12) United States Patent
Yoo et al.

(10) Patent No.: US 9,854,720 B2
(45) Date of Patent: Dec. 26, 2017

(54) ELECTROMAGNETIC WAVE SHILEDING DIELECTRIC FILM

(71) Applicant: Industry-Academic Cooperation Foundation, Yonsei University, Seoul (KR)

(72) Inventors: Jeonghoon Yoo, Seoul (KR); Hyundo Shin, Seoul (KR); Kyoungsik Kim, Seoul (KR)

(73) Assignee: Industry-Academic Cooperation Foundation, Yonsei University, Seoul (KR)

( * ) Notice: Subject to any disclaimer, the term of this patent is extended or adjusted under 35 U.S.C. 154(b) by 0 days.

(21) Appl. No.: 15/135,601

(22) Filed: Apr. 22, 2016

(65) Prior Publication Data
US 2016/0324041 A1    Nov. 3, 2016

(30) Foreign Application Priority Data
Apr. 22, 2015 (KR) .................. 10-2015-0056314

(51) Int. Cl.
 *H05K 9/00* (2006.01)
 *H04B 3/28* (2006.01)
 *H01Q 17/00* (2006.01)

(52) U.S. Cl.
 CPC ........... *H05K 9/0088* (2013.01); *H01Q 17/00* (2013.01)

(58) Field of Classification Search
 CPC .. H05K 1/0216; H05K 1/0218; H05K 1/0219; H05K 1/0221; H05K 1/0222; H05K 1/0224; H05K 1/0225; H05K 2201/09045; H05K 9/00; H05K 9/0081; H05K 9/0088; H01Q 17/008; H01Q 1/42

USPC ............. 174/350, 358, 369, 370, 386, 390; 361/800, 816, 818; 333/211; 343/785
See application file for complete search history.

(56) References Cited

U.S. PATENT DOCUMENTS

| | | | | |
|---|---|---|---|---|
| 3,426,140 A | * | 2/1969 | Templeton | ........... H05K 9/0016 174/369 |
| 3,623,099 A | * | 11/1971 | Suetake | ............... H01Q 17/008 342/4 |
| 3,780,374 A | * | 12/1973 | Shibano | ................. H01Q 1/422 343/872 |
| 4,725,475 A | * | 2/1988 | Fiscus | .................... H01Q 1/422 343/872 |

(Continued)

FOREIGN PATENT DOCUMENTS

JP    2008-135485    6/2008

OTHER PUBLICATIONS

Hyundo Shin et al., Two-dimensional dielectric structure design at microwave frequency range based on the phase field method, The Korean Society of Mechanical Engineers(KSME), KSME Journal, vol. 2014 No. 11 [2014] p. 859-860, Nov. 2014, Republic of Korea.

*Primary Examiner* — Chau N Nguyen
*Assistant Examiner* — Roshn Varghese
(74) *Attorney, Agent, or Firm* — Lex IP Meister, PLLC

(57) ABSTRACT

Disclosed herein is an electromagnetic wave shielding dielectric film. The electromagnetic wave shielding dielectric film includes a lower layer and an upper layer. The lower layer is formed of a dielectric in a plate shape. The upper layer is formed of a dielectric stacked on the lower layer, and is configured to form a periodic pattern of protrusion and depression structures.

22 Claims, 22 Drawing Sheets

(56) References Cited

U.S. PATENT DOCUMENTS

| | | | | | |
|---|---|---|---|---|---|
| 5,416,492 | A | * | 5/1995 | Takahashi | H01Q 13/28 333/237 |
| 7,135,805 | B2 | * | 11/2006 | Yamanouchi | H03H 9/02653 310/313 D |
| 2002/0079987 | A1 | * | 6/2002 | Yip | H03H 3/08 333/193 |
| 2008/0202807 | A1 | * | 8/2008 | Wesselman | H05K 1/0221 174/388 |
| 2011/0031008 | A1 | * | 2/2011 | Kagawa | B32B 3/30 174/377 |

* cited by examiner

• epsil = 10.2

• epsil = 30

US 9,854,720 B2

ELECTROMAGNETIC WAVE SHILEDING DIELECTRIC FILM

BACKGROUND

1. Technical Field

The present invention relates generally to an electromagnetic wave shielding dielectric film, and more particularly to an electromagnetic wave shielding dielectric film that can improve the efficiency of electromagnetic wave shielding and enables the change or adjustment of a target frequency.

2. Description of the Related Art

Recently, with the dramatic development of digital technology, a semiconductor industry and the like, small-sized, lightweight, high-speed, and broad bandwidth electronic/electric devices have appeared. However, such electronic/electric devices are sensitive to slight electromagnetic wave interference, and thus easily suffer from erroneous operation. Countermeasures against electromagnetic wave interference include an electromagnetic wave blocking technique that is designed to block an electromagnetic wave through the reflection of the electromagnetic wave using metal, and an electromagnetic wave absorption technique that is designed to absorb an electromagnetic wave using an electromagnetic wave absorber. However, since the electromagnetic wave blocking technique is disadvantageous in that a blocked unnecessary electromagnetic wave causes additional damage, the electromagnetic wave absorption technique is now more frequently utilized.

FIG. 1 is a sectional view of a conventional monolayer electromagnetic wave absorber. Referring to FIG. 1, a conventional monolayer electromagnetic wave absorber 100 is described as follows. The monolayer electromagnetic wave absorber 100 includes an absorption layer 120, and a boundary layer 130 stacked on the rear surface of the absorption layer 120. The absorption layer 120 functions to absorb an electromagnetic wave, and includes a dielectric lossy material or a magnetic lossy material. The boundary layer 130 functions to block and reflect an electromagnetic wave that is not absorbed by but is transmitted through the absorption layer. The boundary layer 130 is formed of a perfect electric conductor.

As described above, an electromagnetic wave shielding structure using a common dielectric typically requires that a periodic arrangement of electric conductor patterns and a conductor layer for grounding should be provided on a dielectric substrate. Alternatively, an electromagnetic wave shielding structure using a common dielectric has a structure in which a dielectric lossy plate and a magnetic lossy plate are stacked in the form of multiple layers. This electromagnetic wave shielding structure exhibits absorption performance that is continuously attenuated while an electromagnetic wave incident onto the structure is passing through stacked absorption layers ranging from a surface layer to the lowermost layer. Furthermore, the stacked electromagnetic wave shielding structure includes a conductor or a conductive material. Therefore, the stacked electromagnetic wave shielding structure has the problems of having poor absorption or shielding efficiency, being sensitive to a change in target frequency and also having poor electrical stability.

PRECEDING TECHNOLOGY DOCUMENT

Patent Document

Korean Patent Application Publication No. 10-2012-0085956 (published on Aug. 2, 2012)

Korean Patent No. 10-1401769 (registered on Jun. 23, 2014)

SUMMARY

An electromagnetic wave shielding dielectric film according to the present invention has the following objects:

First, at least one embodiment of the present invention is directed to the provision of an electromagnetic wave shielding dielectric film that has high shielding efficiency.

Second, at least one embodiment of the present invention is directed to the provision of an electromagnetic wave shielding dielectric film that enables a target frequency to be easily changed and adjusted.

Third, at least one embodiment of the present invention is directed to the provision of an electromagnetic wave shielding dielectric film that ensures electrical stability, secures safety against the introduction of an excessive current, such as lightning, and enables application to an airplane and outdoor equipment.

In accordance with a first aspect of the present invention, there is provided an electromagnetic wave shielding dielectric film, including: a lower layer formed of a dielectric in a plate shape; and an upper layer formed of a dielectric stacked on the lower layer and configured to form a periodic pattern of protrusion and depression structures.

The protrusion and depression structures may form groove portions in a periodic pattern on upper and lower surfaces of the upper layer, and the groove portions on the upper and lower surfaces may be spaced apart and alternately arranged at regular intervals. Each of the groove portions on the upper surface may have a groove structure in which two groove structures successively neighbor each other, and each of the groove portions on the lower surface may have a single groove structure.

Each of the groove portions on the upper and lower surfaces may have a structure in which a vertical groove structure and an inclined groove structure are combined in a depth direction. Electromagnetic wave shielding efficiency may be adjusted based on the separation distance between the groove portions on the upper surface and the groove portions on the lower surface. Electromagnetic wave shielding efficiency is adjusted based on the depth of the vertical groove structure of each of the groove portions on the upper and lower surfaces.

The lower layer may be a transmission prevention film that prevents an electromagnetic wave from being transmitted therethrough. The permittivities of the upper and lower layers may be different from each other. The permittivities of the upper and lower layers may be identical to each other.

Electromagnetic wave shielding efficiency may be adjusted based on a change in at least any one of widths, heights and thicknesses of the upper and/or lower layers. A target frequency may be adjusted based on a change in at least any one of widths, heights, and thicknesses of the upper and/or lower layers. The sizes, including a width, a height, and a thickness, of the upper layer may be different from those of the lower layer. A protective film may be formed on the uppermost surface of the upper layer.

In accordance with a second aspect of the present invention, there is provided an electromagnetic wave shielding dielectric film, including: a first shielding film including a first lower layer formed of a dielectric in a plate shape, and a first upper layer formed of a dielectric stacked on the first lower layer and configured to form a periodic pattern of protrusion and depression structures; and a second shielding film including a second lower layer formed of a dielectric in a plate shape and stacked on the first upper layer, and a second upper layer formed of a dielectric stacked on the second lower layer and configured to form a periodic pattern of protrusion and depression structures; wherein the electromagnetic wave shielding dielectric film has a multilayer structure in which a plurality of shielding films are stacked.

The protrusion and depression structures may form groove portions on upper and lower surfaces of each of the upper layers of the first and second shielding films in periodic patterns, and the groove portions on the upper and lower surfaces of each of the upper layers of the first and second shielding films may be spaced apart and alternately arranged at regular intervals. Each of the groove portions on an upper surface of each of the upper layers of the first and second shielding films may have a groove structure in which two groove structures successively neighbor each other; and each of the groove portions on a lower surface of each of the upper layers of the first and second shielding films may have a single groove structure.

Each of the groove portions on the upper and lower surfaces may have a structure in which a vertical groove structure and an inclined groove structure are combined in a depth direction. Electromagnetic wave shielding efficiency may be adjusted based on the separation distance between the groove portions on the upper surface and the groove portions on the lower surface. Electromagnetic wave shielding efficiency may be adjusted based on the depth of the vertical groove structure of each of the groove portions on the upper and lower surfaces.

The permittivities of the first and second shielding films may be different from each other. The permittivity of the first shielding film may be higher than the permittivity of the second shielding film. A protective film may be formed on the uppermost surface of the electromagnetic wave shielding dielectric film.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION

Embodiments of the present invention are described with reference to the accompanying drawings below so that those having ordinary knowledge in the art to which the present invention pertains can easily practice the present invention. It will be apparent to those having ordinary knowledge in the art to which the present invention pertains that the following embodiments may be modified and varied within the technical spirit and scope of the present invention. The same reference symbols are assigned to the same or similar components throughout the drawings as much as possible.

The terms used herein are intended to merely refer to components of a specific embodiment, but are not intended to limit the present invention. The singular forms used herein also include plural forms unless clearly defined otherwise.

The terms, including "comprise," "includes," "comprising," "including" and their derivatives, used herein specify the presence of described shapes, numbers, steps, operations, elements, parts and/or groups thereof, but do not exclude the possibility of the presence or addition of one or more other shapes, numbers, steps, operations, elements, parts, and/or groups thereof.

All the terms, including technical or scientific terms, used herein have the same meanings as commonly understood by those skilled in the art to which the present invention pertains. It will be further understood that terms, such as those defined in commonly used dictionaries, should be interpreted as having meanings that are consistent with their meanings in the context of the specification and relevant art and should not be interpreted in an idealized or overly formal sense unless expressly so defined herein.

Embodiments of the present invention are described in detail below with reference to the accompanying drawings.

Figure 1:
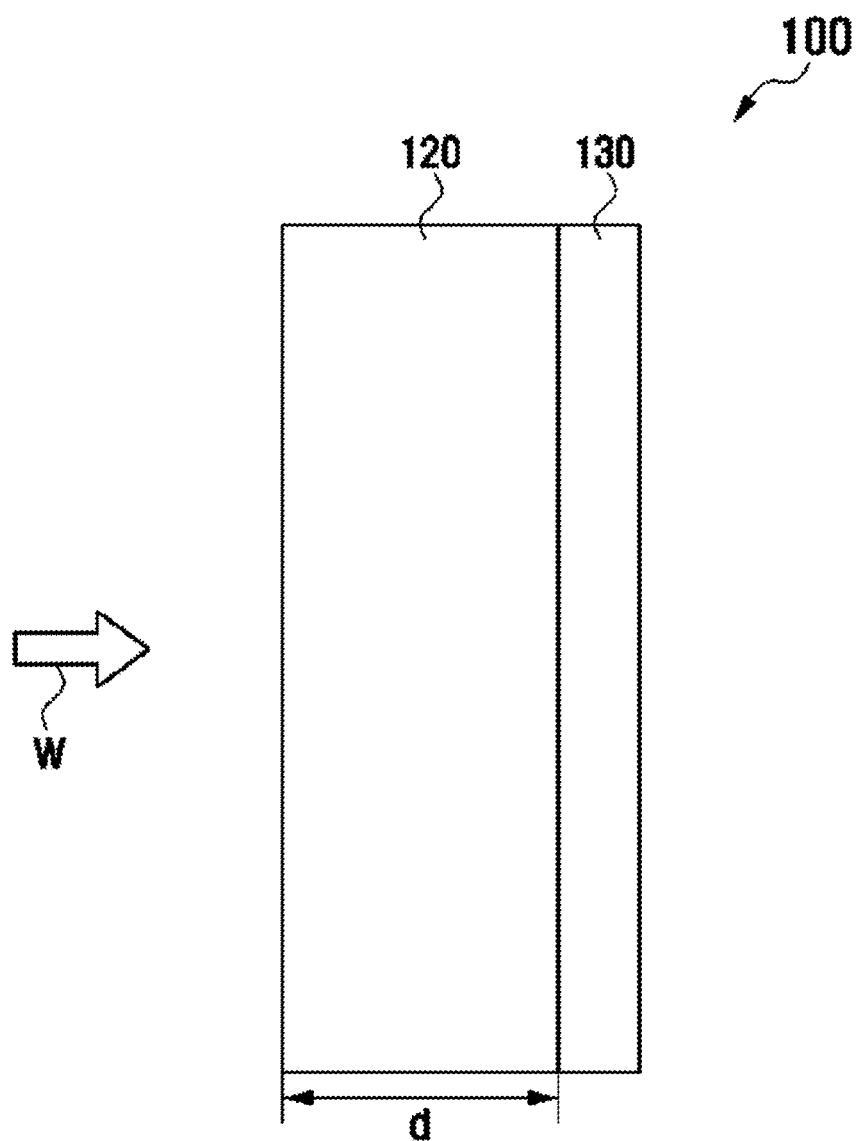
FIG. 1 is a sectional view of a conventional monolayer electromagnetic wave absorber.
Figure 2:
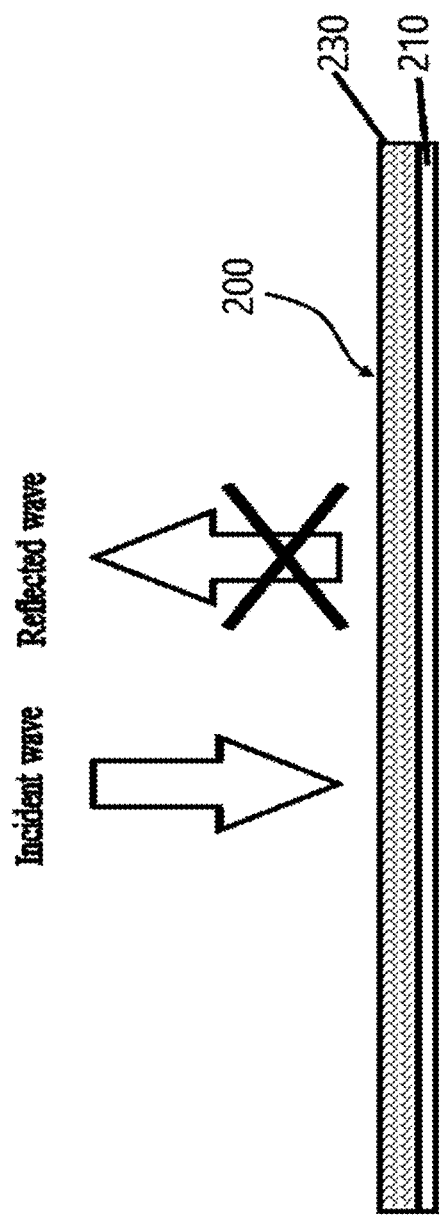
FIG. 2 is a schematic diagram showing the principle of an electromagnetic wave shielding dielectric film according to an embodiment of the present invention.
Figure 3:
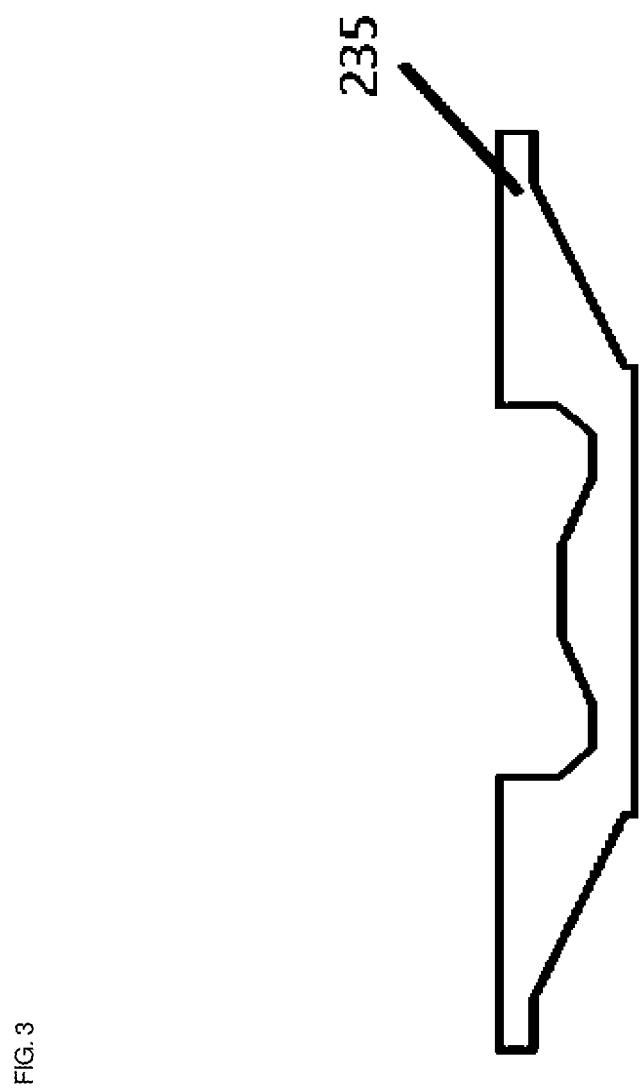
FIG. 3 is a diagram showing the protrusion and depression structure of the upper layer of the electromagnetic wave shielding dielectric film according the embodiment of the present invention.
Figure 4:
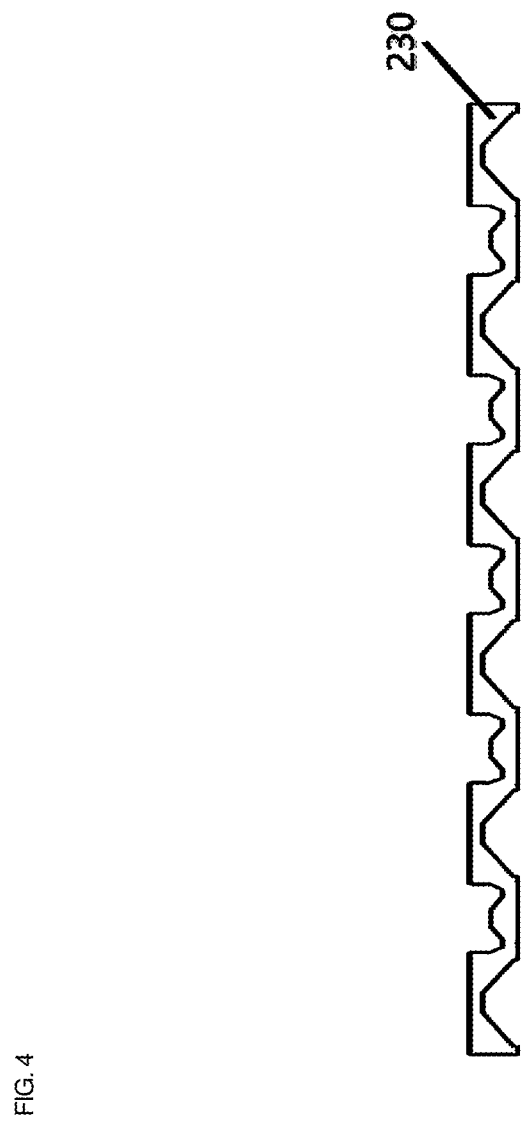
FIG. 4 is a diagram showing the structure of the upper layer of the electromagnetic wave shielding dielectric film according to the embodiment of the present invention.
Figure 5:
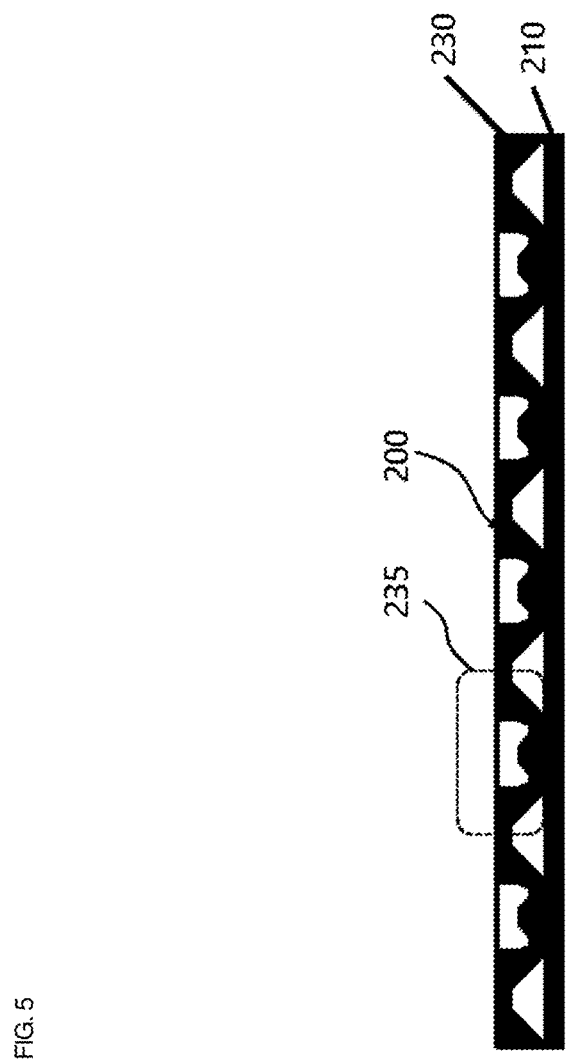
FIG. 5 is a side view showing the structure of the electromagnetic wave shielding dielectric film, in which the upper layer and a lower layer are combined with each other, according to the embodiment of the present invention.

FIG. 2 is a schematic diagram showing the principle of an electromagnetic wave shielding dielectric film 200 according to an embodiment of the present invention, FIG. 3 is a diagram showing the protrusion and depression structure of the upper layer 230 of the electromagnetic wave shielding dielectric film 200 according to the embodiment of the present invention, FIG. 4 is a diagram showing the structure of the upper layer 230 of the electromagnetic wave shielding dielectric film 200 according to the embodiment of the present invention, and FIG. 5 is a side view showing the structure of the electromagnetic wave shielding dielectric film 200, in which the upper layer 230 and a lower layer 210 are combined with each other according to the embodiment of the present invention.

As shown in FIGS. 2 to 5, the electromagnetic wave shielding dielectric film 200 according to the embodiment of the present invention includes the lower layer 210 formed of the dielectric in a plate shape; and the upper layer 230 formed of a dielectric stacked on the lower layer 210, and configured to form a periodic pattern of protrusion and depression structures.

The embodiment of the present invention proposes an electromagnetic wave shielding dielectric film formed of only dielectric material, i.e., a stacked electromagnetic wave shielding dielectric film in which the dielectric upper layer 230 configured to have a periodic pattern of protrusion and depression structures that induces the scattering, refraction, and absorption of an electromagnetic wave incident onto a structure is combined with the lower layer 210 formed as an electromagnetic wave transmission prevention film that prevents an electromagnetic wave from being transmitted through the structure.

The above-described electromagnetic wave shielding dielectric film 200 according to the embodiment of the present invention has the advantage of enabling a change in a target frequency band because the electromagnetic wave shielding dielectric film 200 does not include a conductive material (such as a metal) and employs a stack-type shielding film having different permittivities and using a periodic pattern structure.

As shown in FIGS. 2 and 5, the embodiment of the present invention is directed to a stack structure electromagnetic wave shielding dielectric film in which the upper layer 230 is formed of a dielectric having a periodic pattern of predetermined protrusion and depression structures and the lower layer 210 is formed as a dielectric layer having a plate shape. In the embodiment of the present invention, there is formed a shielding film structure in which an incident electromagnetic wave is trapped through the processes of total reflection, scattering and transmission by the geometrical protrusion and depression structures in the upper layer 230 having protrusion and depression structures and an electromagnetic wave transmitted through the upper layer 230 is reflected back from the lower layer 210 (is prevented from undergoing transmission), thereby blocking the electromagnetic wave without reflection.

More specifically, as shown in FIGS. 3 and 4, the upper layer 230 is formed of a dielectric layer in a structure in which a periodic pattern of protrusion and depression structures is formed. The periodic pattern of protrusion and depression structures allows a part of an electromagnetic wave incident onto the structure to propagate into an external space and another part thereof to be transmitted through the dielectric and refracted, based on the permittivity of the dielectric and reflection and scattering angles. The refracted electromagnetic wave is blocked inside the structure by being absorbed or attenuated due to mutual characteristics between the material having the permittivity and the electromagnetic wave.

When a unit protrusion and depression structure 235 shown in FIG. 3 is periodically formed at regular intervals and thus forms a pattern, the structure of the upper layer 230 shown in FIG. 4 is achieved. The protrusion and depression structure is preferably formed to have groove structures on each of the upper and lower surfaces of the upper layer 230. This has the advantage of facilitating the independent formation of groove structures at regular intervals on each of the upper and lower surfaces of the upper layer 230, and also has an advantage in that the scattering and refraction of an electromagnetic wave are easily induced by forming protrusion and depression structures on each of the upper and lower surfaces, thereby improving the effects of absorbing and blocking an incident electromagnetic wave.

That is, the protrusion and depression structures of the upper layer 230 shown in FIGS. 3 and 4 are preferably configured such that groove portions are formed in a periodic pattern on each of the upper and lower surfaces of the upper layer 230 and the groove portions on the upper and lower surfaces are spaced apart and alternately arranged at regular intervals. The formation of the groove portions on the upper and lower surfaces is intended to improve shielding efficiency for an incident electromagnetic wave as described above, and the formation of a regular periodic pattern is intended to induce uniform shielding efficiency throughout the overall shielding film and to improve the reliability of shielding.

In this case, each of the groove portions on the upper surface preferably has a groove structure in which two groove structures successively neighbor each other, and each of the groove portions on the lower surface preferably has a single groove structure. Each of the groove portions on the upper and lower surfaces preferably has a structure in which a vertical groove structure and an inclined groove structure are combined with each other in a depth direction. As described above, the structure of the electromagnetic wave shielding dielectric film according to the embodiment of the present invention is configured such that protrusion and depression structures are formed on the upper layer 230, groove portions are alternately formed on the upper and lower surfaces, and each of the groove portions on the upper surface is formed in a groove structure in which two groove structures successively neighbor each other. Accordingly, the structure effectively induces absorption, scattering, and the like while laterally moving an incident electromagnetic wave, thereby improving shielding efficiency.

Furthermore, the electromagnetic wave shielding dielectric film according to the embodiment of the present invention is preferably configured such that electromagnetic wave shielding efficiency is adjusted based on a separation distance between the groove portions on the upper surface of the upper layer 230 and the distance between the groove portions on the lower surface thereof and such that electromagnetic wave shielding efficiency is adjusted based on the depths of the vertical groove structures of the groove portions on the upper and lower surfaces. The reason for this is that the optimal design of a structure having high electromagnetic wave shielding efficiency can be achieved by changing the sizes, angles, and the like of the structure, such as the separation distance between the groove structures formed on upper and lower surfaces, the vertical depths of the groove structures, and the like.

Furthermore, as shown in FIG. 5, the dielectric shielding film according to the embodiment of the present invention is preferably configured such that the lower layer 210 is formed in the form of an electromagnetic wave transmission prevention film having a plate shape. In order to completely block an electromagnetic wave transmitted through the upper layer 230 and transmitted to the lower layer 210, exclusive of an electromagnetic wave trapped or blocked in the upper layer 230, the dielectric layer of the lower layer 210 is preferably a transmission prevention film that prevents an electromagnetic wave from being transmitted therethrough by reflecting the electromagnetic wave.

As described above, the embodiment of the present invention proposes the electromagnetic wave shielding dielectric film 200 having high shielding efficiency, in which an incident electromagnetic wave is blocked via the upper layer 230 having a periodic pattern of protrusion and depression structures and a residual electromagnetic wave is completely blocked through reflection via the lower layer 210 having a plate shape, thereby increasing a possibility that an electromagnetic wave reflected back and transmitted to the upper layer 230 is completely blocked while undergoing scattering, refraction and absorption.

Furthermore, another characteristic of the electromagnetic wave shielding dielectric film 200 according to the embodiment of the present invention resides in that the electromagnetic wave shielding dielectric film 200 is a pure dielectric shielding film without any conductive material.

Generally, electromagnetic wave shielding methods are classified into magnetic field shielding and conductive shielding.

The magnetic field shielding is designed to surround a magnetic field generation source or cover a part, to be affected, with a material having desired permeability, such as permalloy foil, a silicon steel plate, an amorphous strip, or the like, thereby allowing a magnetic field to flow to another part along the surface of the shielding material. The magnetic field shielding is applied to a transformer or the like in which a magnetic field stronger than an electric field is generated.

The conductive shielding is a method of covering the case of a device, to be protected against an electromagnetic wave, with a conductive material, such as a thin copper film, a thin aluminum film, a steel plate, or the like. The principle of the shielding resides in that electromagnetic wave noise generated in the internal circuit of a device or transferred from another external device is reflected while colliding with the surface of the case or is allowed to flow to a ground. The shielding rate at which an electromagnetic wave is transmitted to the inside or outside of the case varies depending on the material and thickness of a conductive material and the frequency and energy strength of an electromagnetic wave.

The electromagnetic wave shielding methods are designed to simply reflect or scatter an electromagnetic wave. The electromagnetic wave shielding methods are problematic in that the erroneous operation and noise of an electronic device may be increased by a reflected electromagnetic wave. With regard to radioactive noise, a gap may be present in a shielding wall even when shielding is completely performed, and there is a possibility that interference occurs when an unnecessary electromagnetic wave generated by a part disposed inside a system, particularly an internal oscillator, is reflected from a shielding wall. Accordingly, an electromagnetic wave absorber that absorbs an unnecessary electromagnetic wave, rather than blocking it, has attracted increasing attention.

An electromagnetic wave absorber does not generate a reflected wave unlike an electromagnetic wave shield because the electromagnetic wave absorber absorbs incident noise and converts it into heat. An electromagnetic wave absorber is responsible for various important functions, including the function of suppressing noise that causes the erroneous operation of an electronic device, the function of suppressing cross-talk between circuit blocks or galvanic coupling between substrates that are closely disposed, the function of improving the reception sensitivity of an antenna, the function of reducing the influence of an electromagnetic wave on the human body, and the like.

Therefore, the embodiment of the present invention proposes an improved electromagnetic wave shielding dielectric film in which a shielding film structure includes a layer having a periodic pattern of predetermined protrusion and depression structures and is formed of only a dielectric without any conductive material, unlike a conventional electromagnetic wave shield that includes a conductive material. Accordingly, the improved electromagnetic wave shielding dielectric film may suppress noise, may reduce interference with an adjacent device, and may minimize the influence of an electromagnetic wave on the human body.

Furthermore, the electromagnetic wave shielding dielectric film 200 according to the embodiment of the present invention relates to a dielectric shielding film that blocks an extremely high frequency-band electromagnetic wave having a few-millimeter wavelength. The electromagnetic wave shielding dielectric film 200 has the advantage of being applied to technologies for reducing detection attributable to a reflected wave generated when an electromagnetic wave emitted from radar collides with a target, and also has the advantage of being applied to military radar and stealth technologies in a radio frequency (RF) field.

That is, as shown in FIGS. 3 to 5, respective dielectric layers of the upper and lower layers 230 and 210 of the electromagnetic wave shielding dielectric film according to the embodiment of the present invention have different functions according to their location. The upper layer 230 is configured to have a periodic pattern of unit structures (see FIG. 3), such as dielectric protrusion and depression structures. As described above, a part of a wave incident onto the dielectric structure having the periodic pattern is scattered and propagates into an external space, and the remainder of the incident wave is refracted and blocked inside the structure and flows along a path of the dielectric pattern structure.

The lower layer 210 is a transmission prevention film that prevents a wave from being transmitted therethrough so that a wave incident onto the structure is prevented from being transmitted through the dielectric shielding film. The lower layer 210 prevents an electromagnetic wave, generated by a source, from reaching a target. The upper layer 230 having a periodic pattern and the lower layer 210 having a plate-shaped dielectric layer are combined into the single electromagnetic wave shielding dielectric film 200.

Furthermore, as shown in FIG. 5, the electromagnetic wave shielding dielectric film 200 according to the embodiment of the present invention may enable a change of target frequency based on a change of permittivity attributable to the replacement of a dielectric. Accordingly, a target frequency may be decreased by introducing a dielectric having high permittivity, and a microwave may be blocked based on the characteristics of the decreased frequency.

That is, the dielectric shielding film according to the embodiment of the present invention may be configured such that the upper and lower layers 230 and 210 having different permittivities are combined with each other, so that shielding efficiency can be improved by increasing the possibility that refraction and scattering phenomena occur and the target frequency can be precisely selected by controlling the individual permittivities.

Furthermore, the electromagnetic wave shielding dielectric film 200 according to the embodiment of the present invention is preferably configured such that the uppermost surface of the upper layer 230 forms a protective film. The reason for this is that the structure can be protected and also a wave incident onto the structure is prevented from propagating into an external space by providing the protective film having low friction coefficient and excellent chemical resistance, thereby improving the effect of blocking an electromagnetic wave, with the result that the electromagnetic wave shielding dielectric film 200 expected to have a further improved detection avoidance effect can be provided.

Figure 6:
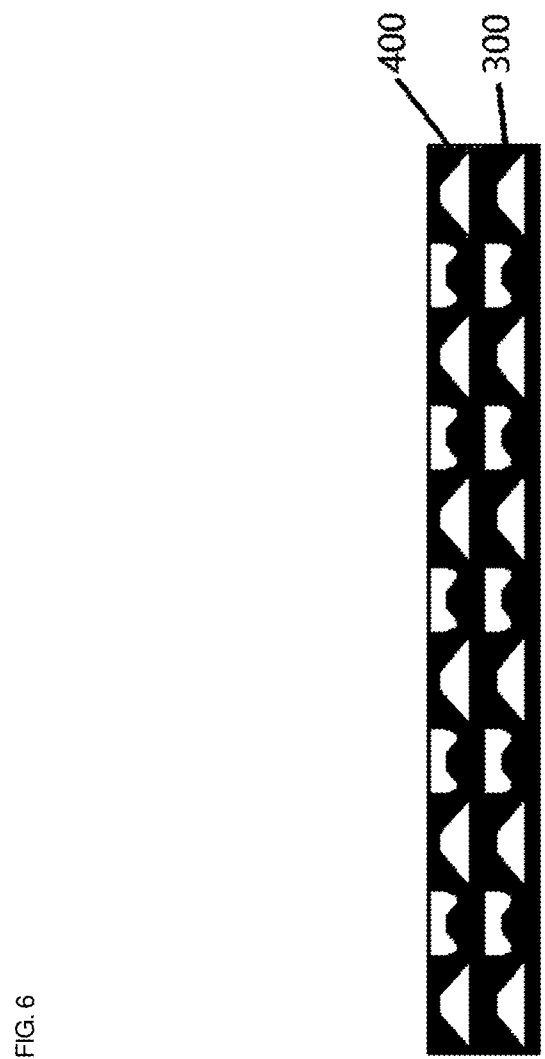
FIG. 6 is a side view showing the configuration of an electromagnetic wave shielding dielectric film according to another embodiment of the present invention.

FIG. 6 is a side view showing the configuration of an electromagnetic wave shielding dielectric film according to another embodiment of the present invention. As shown in FIG. 6, the electromagnetic wave shielding dielectric film according to the embodiment of the present invention includes: a first shielding film 300 including a first lower layer 210 formed of a dielectric in a plate shape and a first upper layer formed of a dielectric stacked on the first lower layer 210, and configured to form a periodic pattern of protrusion and depression structures; and a second shielding film 400 including a second lower layer formed of a dielectric in a plate shape and stacked on the first upper layer, and a second upper layer formed of a dielectric stacked on the second lower layer, and configured to form a periodic pattern of protrusion and depression structures. The electromagnetic wave shielding dielectric film is a multilayer structure in which a plurality of shielding films is stacked on each other.

The embodiment illustrated in FIG. 6 is directed to a structure in which the shielding films according to the embodiment of FIG. 5, in which the upper and lower dielectric layers are combined with each other, are stacked in the same film. The formation of the multilayer structure in which a plurality of shielding films is stacked on each other provides advantages in that electromagnetic wave shielding rate can be improved, a target frequency can be precisely adjusted and the range of selection of target frequencies can be increased.

More specifically, the embodiment of the present invention proposes a structure in which a plurality of shielding films, including the first shielding film 300 and the second shielding film 400, in each of which the upper layer having a periodic pattern of protrusion and depression structures and the lower layer, i.e., an electromagnetic wave transmission prevention film, formed of a dielectric layer in a plate shape are combined and stacked on each other, as shown in FIG. 5, are stacked on each other. The multilayer structure provides advantages in that an electromagnetic wave shielding rate can be improved and the range of selection of target frequencies can be increased by forming a structure in which at least two or more shielding films are combined with each other.

That is, the dielectric shielding film according to the embodiment of the present invention is configured to form a structure that is obtained by stacking two shielding films having different permittivities. As shown in FIG. 6, the embodiment of the present invention proposes a structure in which a dielectric shielding film having low permittivity is disposed in an upper portion and a dielectric shielding film having high permittivity is disposed in a lower portion, thereby enabling electromagnetic wave shielding in a frequency band lower than an existing target frequency.

Figure 7:
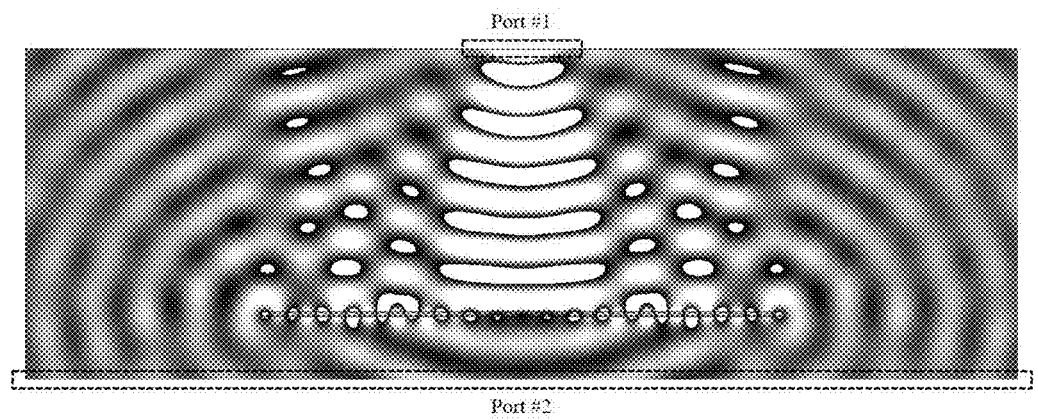
FIG. 7 is a schematic diagram showing an electric field distribution for the single electromagnetic wave shielding dielectric film shown in FIG. 5.

FIG. 7 is a schematic diagram showing an electric field distribution for the single electromagnetic wave shielding dielectric film shown in FIG. 5. As shown in FIG. 7, an applied target frequency is about 10 GHz. It can be seen that an electromagnetic wave emitted from an input end does not transmit through the shielding film and is reflected and a reflected wave is not reflected to an output port.

Figure 8:
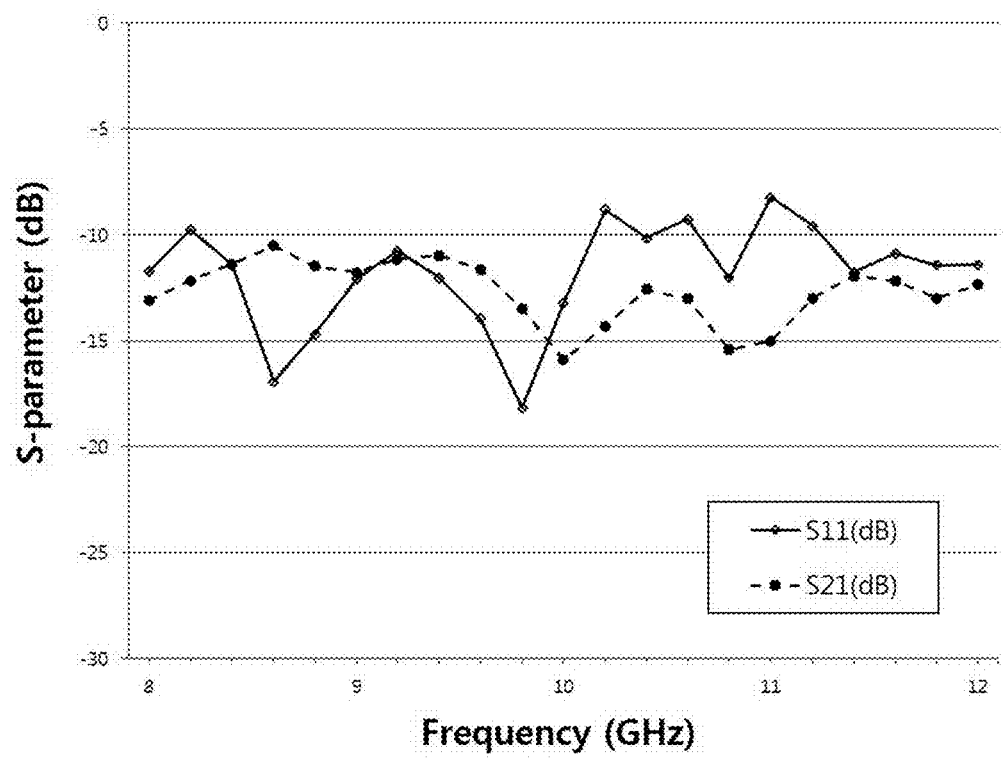
FIG. 8 is a graph showing the frequency characteristics of the electromagnetic wave shielding dielectric film waveguide according to the embodiment of the present invention.

FIG. 8 is a graph showing the frequency characteristics of the electromagnetic wave shielding dielectric film waveguide according to the embodiment of the present invention. When a target frequency in the x-ray band (ranging from about 8 to about 12 GHz) is applied to the single electromagnetic wave shielding dielectric film illustrated in FIG. 5A, frequency characteristics are represented in decibels (dB).

As shown in FIG. 8, when the distance between the input end and the structure is about 10 cm, the frequency characteristics in the X-band (ranging from about 8 to about 12.5 GHz) exhibit an average reflectivity of about 6.5% and a transmittance of about 5.5%. If the distance between the input end and the structure increases, the reflectivity and the transmittance approach about 0%. In the case where actual radar performs radio detection, the distance between radar and an object to be detected ranges from tens of kilometers to hundreds of kilometers, and thus reflectivity and transmittance are expected to approach about 0% when the shielding film presented by the present invention is applied to the avoidance of detection. Therefore, it can be seen that the electromagnetic wave shielding dielectric film proposed by the present invention can provide high performance as a part of stealth equipment.

An example of a test that is conducted to analyze the performance of a shielding film based on changes in the parameters of a unit protrusion and depression structure in an electromagnetic wave shielding dielectric film according to an embodiment of the present invention is described in detail below with reference to the accompanying drawings.

Figure 9:
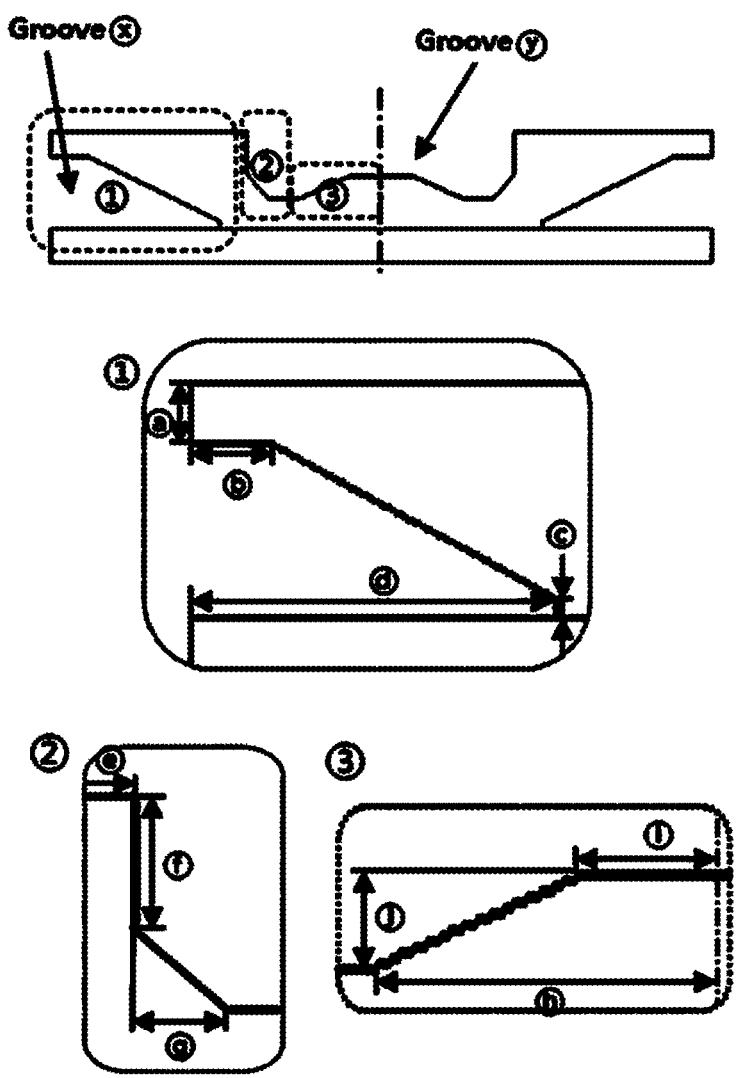
FIG. 9 is a schematic diagram showing an analysis structure for a performance comparison test based on the structure of the unit protrusion and depression structure of the electromagnetic wave shielding dielectric film according to the embodiment of the present invention.

FIG. 9 is a schematic diagram showing an analysis structure for a performance comparison test based on the structure of the unit protrusion and depression structure of the electromagnetic wave shielding dielectric film according to the embodiment of the present invention. As shown in FIG. 9, in order to analyze performance based on the protrusion and depression structures of the upper layer of the electromagnetic wave shielding dielectric film according to the embodiment of the present invention, an influence on the performance of an RF-shield and a related principle were examined by analyzing electromagnetic behavior that occurred when an single-wavelength electromagnetic wave having a target frequency of about 10 GHz was emitted to a shielding film having a thickness of about 3 mm, in which a lower layer having a thickness of about 0.75 mm was formed, and the shapes (sizes and angles) of three parts ①, ②, and ③ were changed. In this case, the unit protrusion and depression structure fundamentally is laterally symmetrical with respect to a vertical center line, and thus all changes in size which will be presented below correspond to values that were obtained by measuring the same changes in the size of the same portion in terms of bilateral symmetry.

Figure 10:
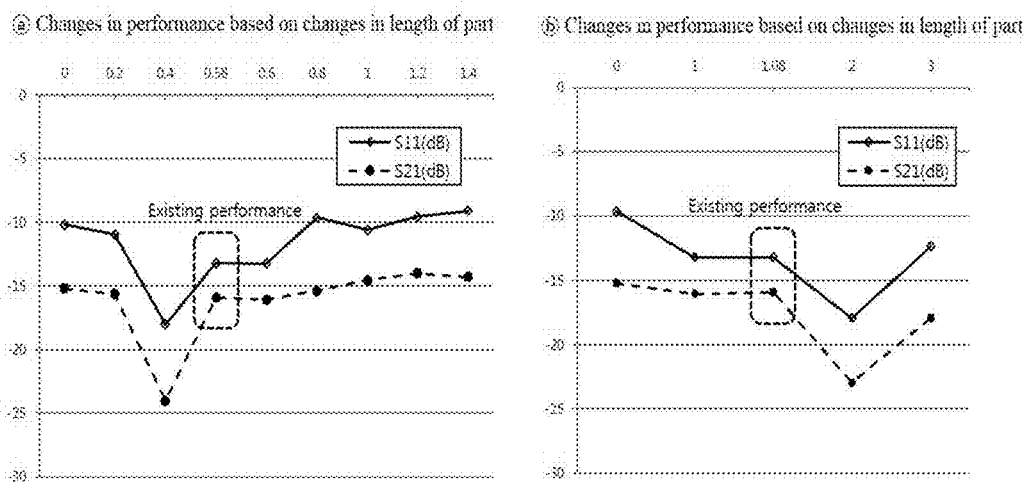
FIG. 10 depicts graphs showing changes in performance based on changes in the lengths of the parts (a) and (b) of the unit protrusion and depression structure of the electromagnetic wave shielding dielectric film according to the embodiment of the present invention.

FIG. 10 depicts graphs showing changes in performance based on changes in the lengths of the parts ⓐ and ⓑ of the unit protrusion and depression structure of the electromagnetic wave shielding dielectric film according to the embodiment of the present invention. As shown in FIG. 10, as a result of the measurement of transmittance S11 (in dB) and reflectivity S21 (in dB) based on changes in size, i.e., changes in the length of the part ① of the three analysis structures for analyzing the unit protrusion and depression structure, the following results were obtained. When the length of the part ⓐ became longer than a specific length, the quantity of an electromagnetic wave reflected by the surface of the structure increased. Accordingly, it can be seen that the quantity of an electromagnetic wave infiltrated into an internal space decreased. In contrast, when the length of the part ⓐ was excessively short, an incident wave could not be blocked inside the internal space of the structure, and was reflected.

Furthermore, it can be seen that when the length of the part ⓑ become shorter or longer than the specific length, an electromagnetic wave blocked inside the structure did not completely propagate to the opposite ends of the structure, and thus performance decreased.

Figure 11:
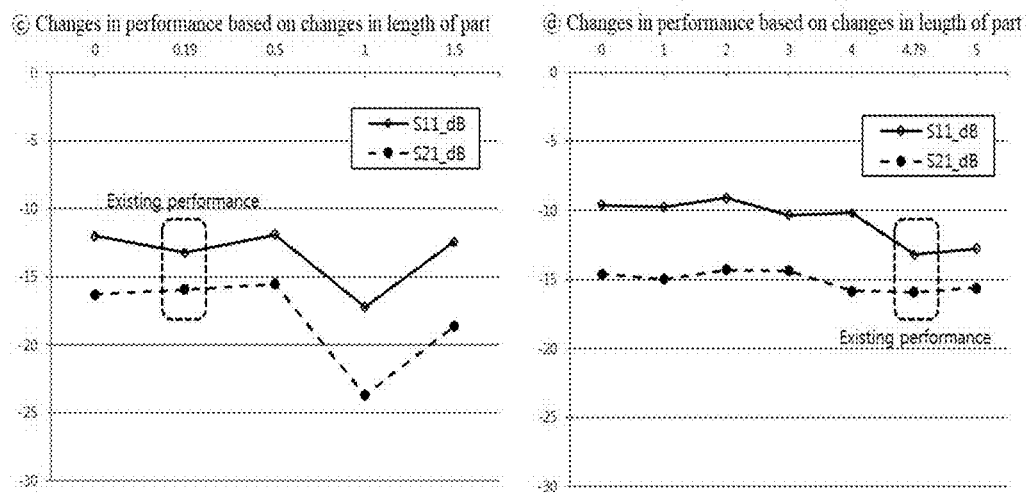
FIG. 11 depicts graphs showing changes in performance based on changes in the lengths of the parts (c) and (d) of the unit protrusion and depression structure of the electromagnetic wave shielding dielectric film according to the embodiment of the present invention.

FIG. 11 depicts graphs showing changes in performance based on changes in the lengths of the parts ⓒ and ⓓ of the unit protrusion and depression structure of the electromagnetic wave shielding dielectric film according to the embodiment of the present invention. As shown in FIG. 11, as a result of the measurement of transmittance S11 (in dB) and reflectivity S21 (in dB) based on changes in size, i.e., changes in the lengths of the part ① of the three analysis structures for analyzing the unit protrusion and depression structure, the following results were obtained. When the length of the part ⓒ was a specific length, an electromagnetic wave could not propagate desirably to the opposite ends of the structure, but was prevented from being transmitted and being reflected to port1. Accordingly, it can be seen that the structure having the specific length exhibited more improved performance than an existing structure. However, it can be seen that the change in the length of the part ⓓ did not significantly influence the performance of the structure.

Figure 12:
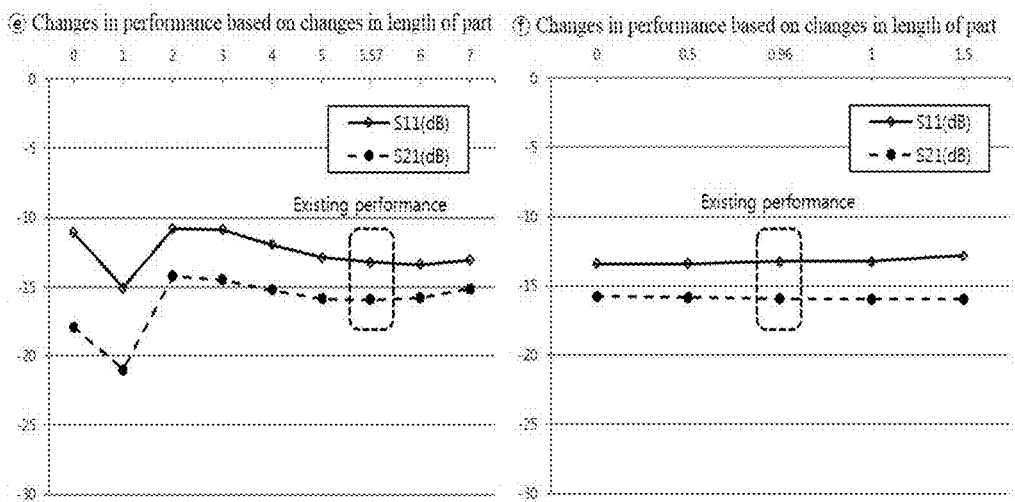
FIG. 12 depicts graphs showing changes in performance based on changes in the lengths of the parts (e) and (f) of the unit protrusion and depression structure of the electromagnetic wave shielding dielectric film according to the embodiment of the present invention.

FIG. 12 depicts graphs showing changes in performance based on changes in the lengths of the parts ⓔ and ⓕ of the unit protrusion and depression structure of the electromagnetic wave shielding dielectric film according to the embodiment of the present invention. As shown in FIG. 12, as a result of the measurement of transmittance S11 (in dB) and reflectivity S21 (in dB) based on changes in size, i.e., changes in the lengths of the part ② of the three analysis structures for analyzing the unit protrusion and depression structure, the following results were obtained. When the length of the part ⓔ was a specific length, an electromagnetic wave did not propagate desirably to the opposite ends of the structure, but was prevented from being transmitted and being reflected to the port1. Accordingly, the structure having the specific length exhibited more improved performance than an existing structure.

That is, it is determined that the shapes of electromagnetic waves in the most excellent structures based on changes in the lengths of the parts ⓒ and ⓔ were similar to each other and the thickness of the wing-shaped portion of each unit protrusion and depression structure controlled the quantity of an electromagnetic wave entering into the structure and influenced the angle of the reflected electromagnetic wave. In this case, the thickness of the wing-shaped portion corresponds to the depth of the vertical groove structure of a lower groove structure.

Figure 13:
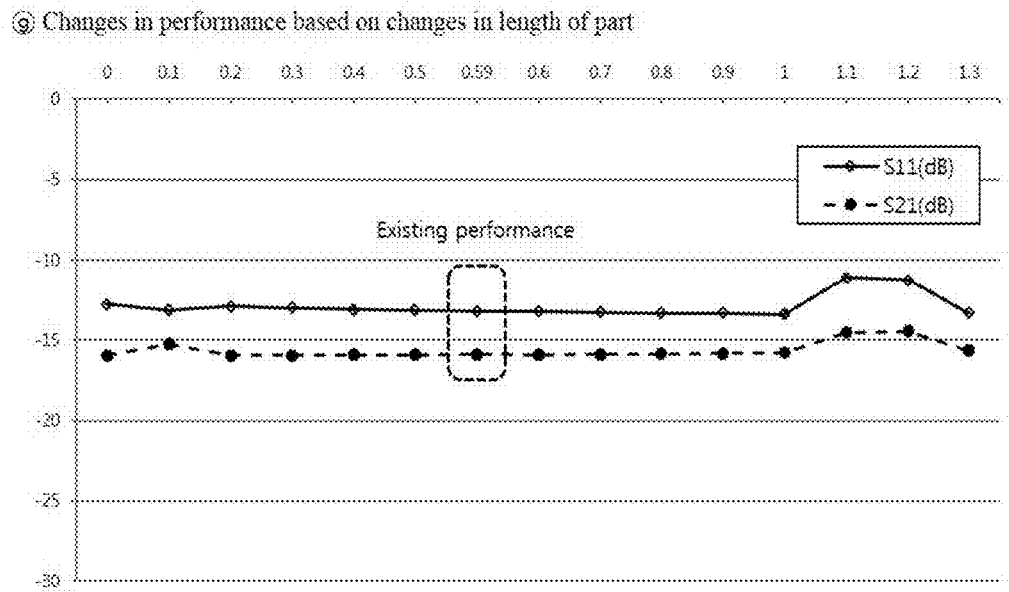
FIG. 13 is a graph showing changes in performance based on changes in the length of the part (g) of the unit protrusion and depression structure of the electromagnetic wave shielding dielectric film according to the embodiment of the present invention.

FIG. 13 is a graph showing changes in performance based on changes in the length of the part ⓖ of the unit protrusion and depression structure of the electromagnetic wave shielding dielectric film according to the embodiment of the present invention. As shown in FIG. 13, as a result of the measurement of transmittance S11 (in dB) and reflectivity S21 (in dB) based on changes in size, i.e., changes in the lengths of the part ② of the three analysis structures for analyzing the unit protrusion and depression structure, it can be seen that the length of the part ⓖ did not significantly influence the performance of the structure.

Figure 14:
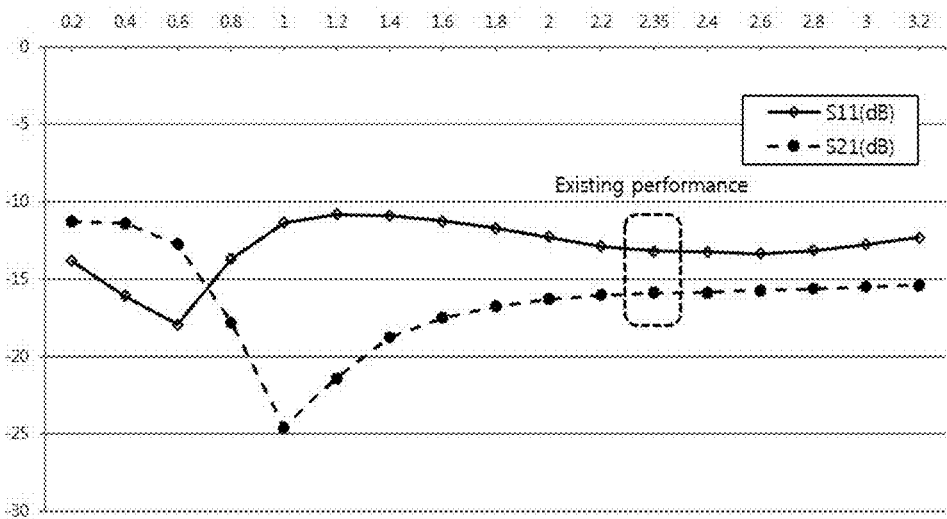
FIG. 14 is a graph showing changes in performance based on changes in the length of the part (h) of the unit protrusion and depression structure of the electromagnetic wave shielding dielectric film according to the embodiment of the present invention.

FIG. 14 is a graph showing changes in performance based on changes in the length of the part ⓗ of the unit protrusion and depression structure of the electromagnetic wave shielding dielectric film according to the embodiment of the present invention. As shown in FIG. 14, as a result of the measurement of transmittance S11 (in dB) and reflectivity S21 (in dB) based on changes in size, i.e., changes in the lengths of the part ③ of the three analysis structures for analyzing the unit protrusion and depression structure, the following results were obtained. The change in the length of the part ⓗ controlled the quantity of an electromagnetic wave propagating to the opposite ends of the structure, and influenced the angle of a reflected wave and the quantity of an electromagnetic wave transmitted through the structure. Accordingly, it can be seen that the quantity of an electromagnetic wave reflected to the port1 decreased even when the strength of the electromagnetic wave propagating to the opposite ends of the structure was slightly weak.

Furthermore, with regard to performance in dB, when the length of the part ⓗ was equal to or shorter than about 0.8 mm, transmission S21 was higher than reflection S11. Accordingly, it is determined that only if the length of the part ⓗ is maintained at a value larger than a predetermined value, a wave transmitted through the structure can be blocked, and thus performance higher than a certain level can be maintained.

Figure 15:
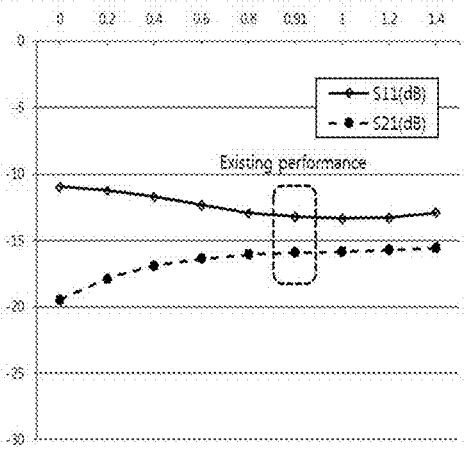
FIG. 15 depicts graphs showing changes in performance based on changes in the lengths of the parts (i) and (j) of the unit protrusion and depression structure of the electromagnetic wave shielding dielectric film according to the embodiment of the present invention.
Figure 15:
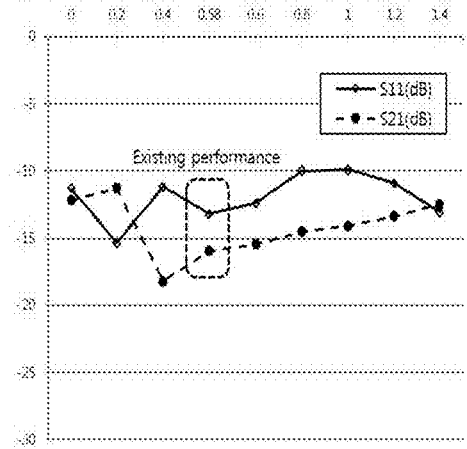

FIG. 15 depicts graphs showing changes in performance based on changes in the lengths of the parts ⓘ and ⓙ of the unit protrusion and depression structure of the electromagnetic wave shielding dielectric film according to the embodiment of the present invention. As shown in FIG. 15, as a result of the measurement of transmittance S11 (in dB) and reflectivity S21 (in dB) based on changes in size, i.e., each of changes in the lengths of the part ③ of the three analysis structures for analyzing the unit protrusion and depression structure, the following results were obtained. That is, it is determined that the change in the length of the part ⓘ did not significantly influence the performance of the structure and the length of the part ⓙ implemented desirable performance when the length was a specific length, influenced the quantity of an electromagnetic wave propagating to the opposite ends of the structure, but did not significantly influence the angle of a reflected wave.

As illustrated in FIGS. 10 to 15, comparing performances based on the sizes and angles of the unit protrusion and depression structure of the electromagnetic wave shielding dielectric film according to the embodiment of the present invention, the change in the parameter of the part ① of a lower groove portion exhibited the most distinctive change in performance and, in particular, the change in performance change was highly influenced by the depth of the vertical groove structure of the lower groove portion.

Furthermore, as described above, it can be seen that the change in the parameter of the lower groove portion changed the strength of an electromagnetic wave that propagated to the opposite ends of the structure. It can be seen that when the strength of a wave that propagated to the opposite ends of the structure was strong, an electromagnetic wave that propagated along the structure undergone transmission, reflection or scattering in individual parts of the structure.

Accordingly, in the electromagnetic wave shielding dielectric film according to the embodiment of the present invention, the change in the parameter of a protrusion and depression structure having a predetermined size caused an incident wave to be blocked inside the structure, the incident wave to propagate to the opposite ends of the structure, and the incident wave to be prevented from being reflected to the port1, thereby improving the performance of the shielding film. Therefore, there is provided an improved electromagnetic wave shielding dielectric film that can achieve the effect of controlling the shielding efficiency of the shielding film via the change in the specific parameter of a unit protrusion and depression structure.

An example of a test that was conducted to analyze changes in the performance and target frequency of the shielding film based on changes in the permittivities and sizes (including the width, height, and thickness) of the upper layer having a unit protrusion and depression structure and the lower layer having a plate shape in the electromagnetic wave shielding dielectric film according to the embodiment of the present invention is described in detail below with reference to the accompanying drawings.

Figure 16:
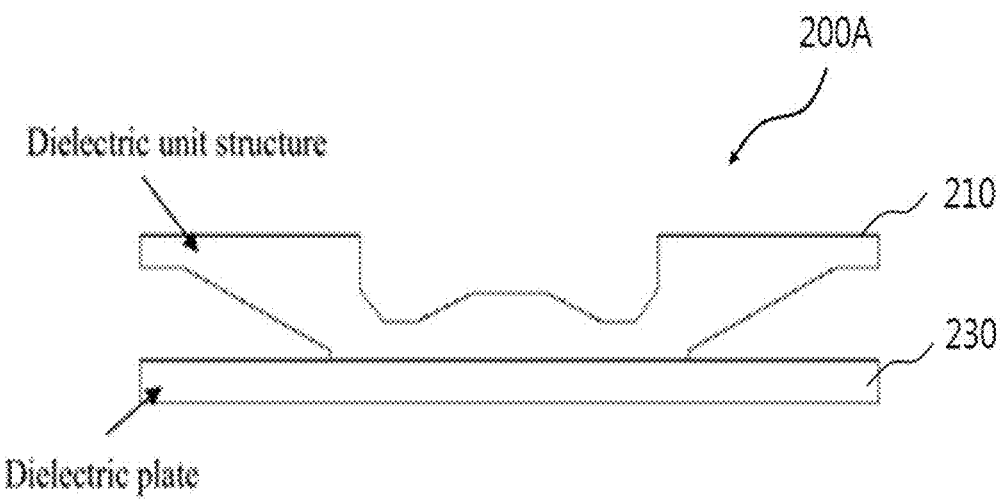
FIG. 16 is a diagram illustrating the structure of a unit shielding film including a unit protrusion and depression structure for testing changes in the performance and target frequency of the electromagnetic wave shielding dielectric film according to the embodiment of the present invention.

FIG. 16 is a diagram illustrating the structure of a unit shielding film 200A including a unit protrusion and depression structure for a test on changes in the performance and target frequency of an electromagnetic wave shielding dielectric film according to an embodiment of the present invention. As shown in FIG. 16, in the embodiment of the present invention, the unit shielding film 200A configured to have an upper layer, including a unit protrusion and depression structure, and a lower layer is illustrated in order to analyze changes in the performance and target frequency of a shielding film based on changes in the sizes and permittivities of the upper and lower layers.

Referring to FIGS. 17 to 27, the changes in the performance and target frequency of the electromagnetic wave shielding dielectric film according to the embodiment of the present invention were analyzed by changing the unit shielding film 200A, i.e., changing at least one of the widths, heights and thicknesses of the upper and/or lower layers or changing the permittivities of the upper and/or lower layers. Since the electromagnetic wave shielding dielectric film according to the embodiment of the present invention had a structure in which the unit shielding films 200A were periodically arranged in the form of a pattern, the change in the structure of the unit shielding film 200A results in the change in the structure of the overall shielding film, and an effect attributable to the change in the structure of the overall shielding film could be reasonably expected to be the same as an effect attributable to the change in the structure of the unit shielding film 200A.

Figure 17:
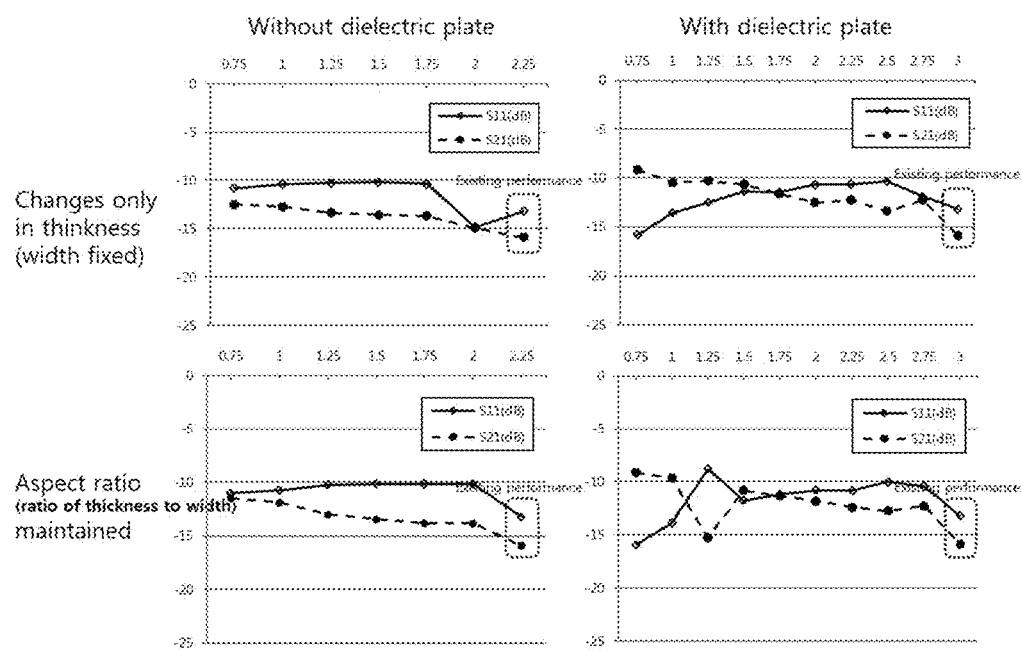
FIG. 17 depicts graphs showing the performances of a unit shielding film based on changes in the thickness of the unit protrusion and depression structure according to the embodiment of the present invention.
Figure 18:
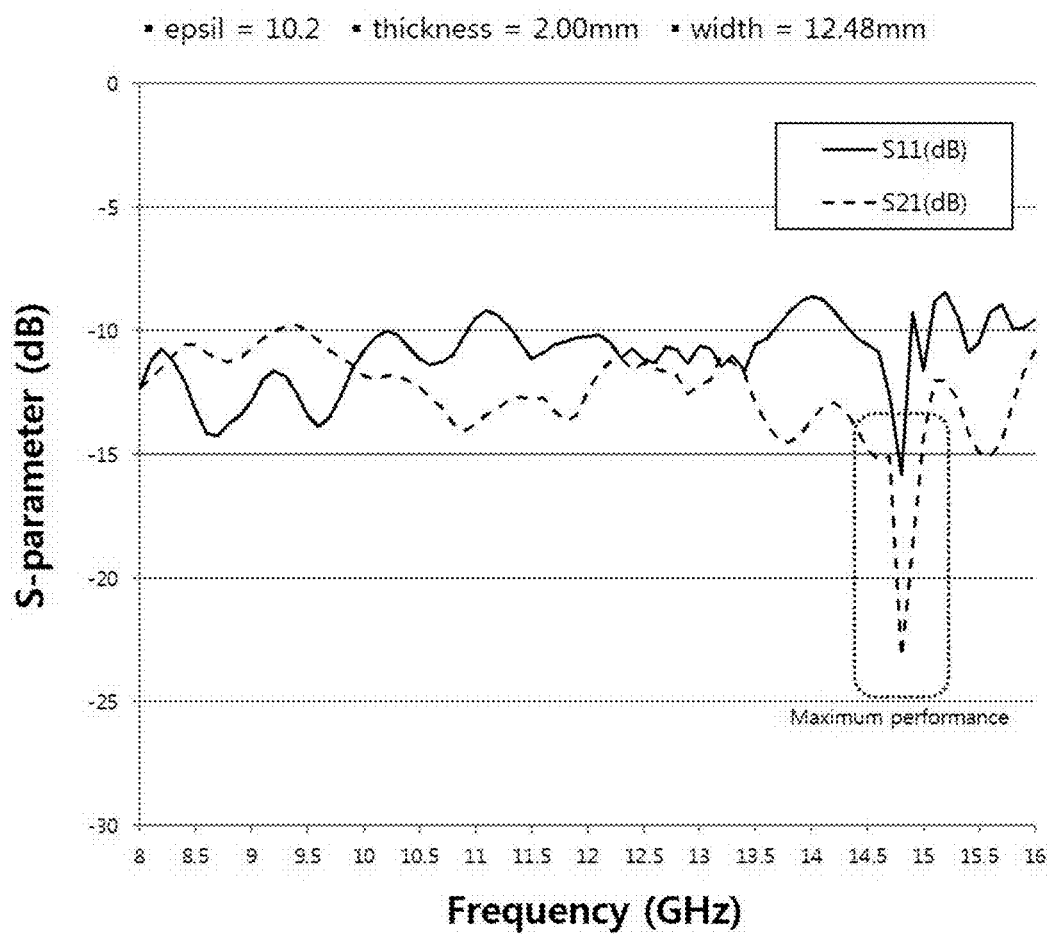
FIGS. 18 to 23 are graphs showing frequency band distributions based on changes in the sizes (including the widths, heights, and thicknesses) of the upper and lower layers of the unit shielding film according to the embodiment of the present invention.
Figure 19:
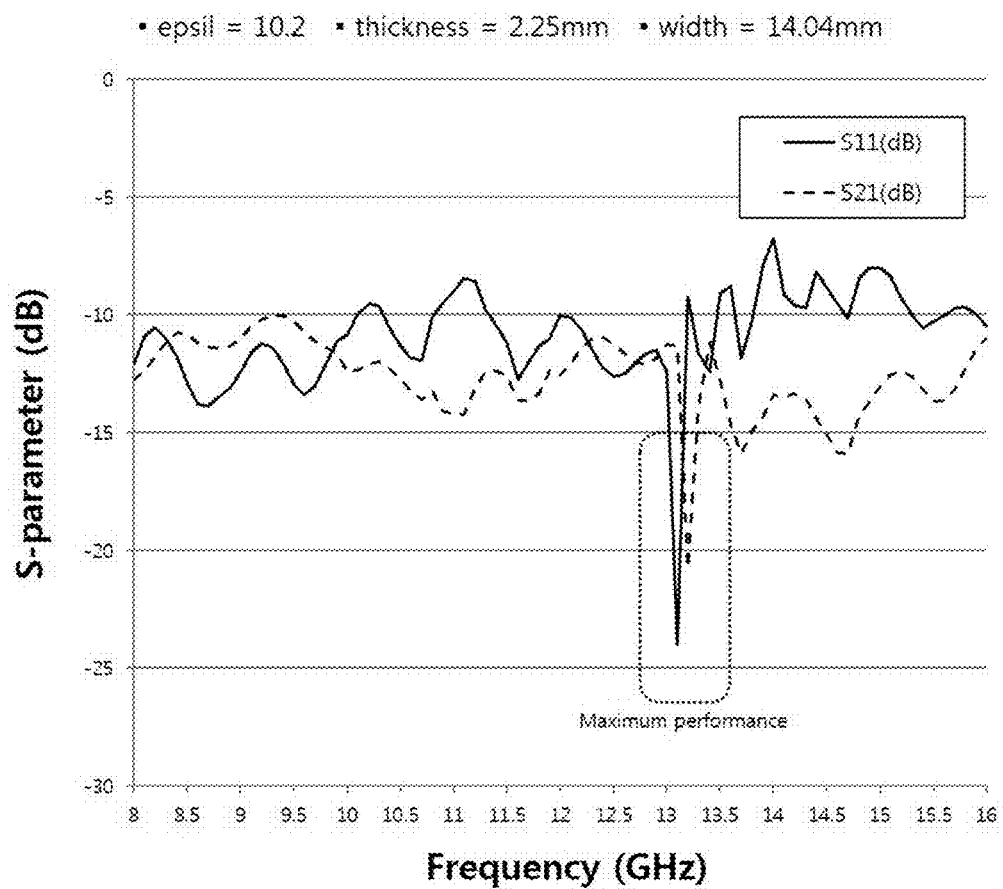
Figure 20:
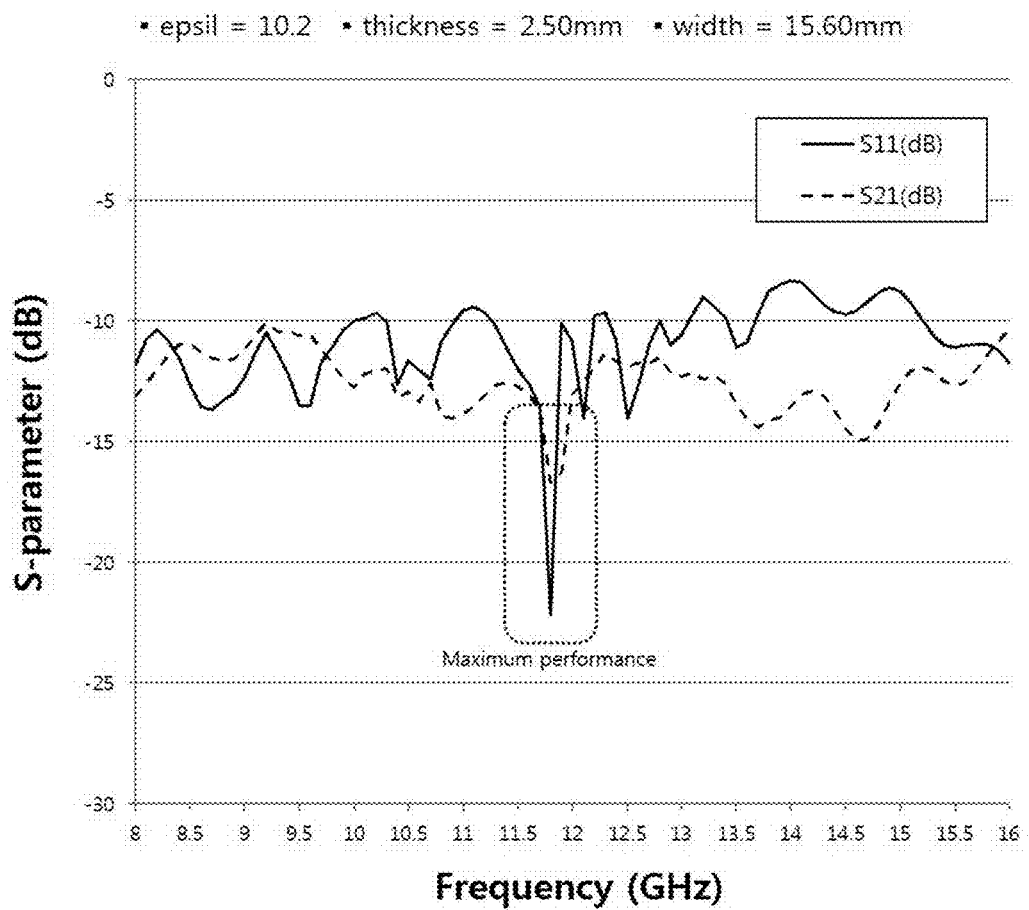
Figure 21:
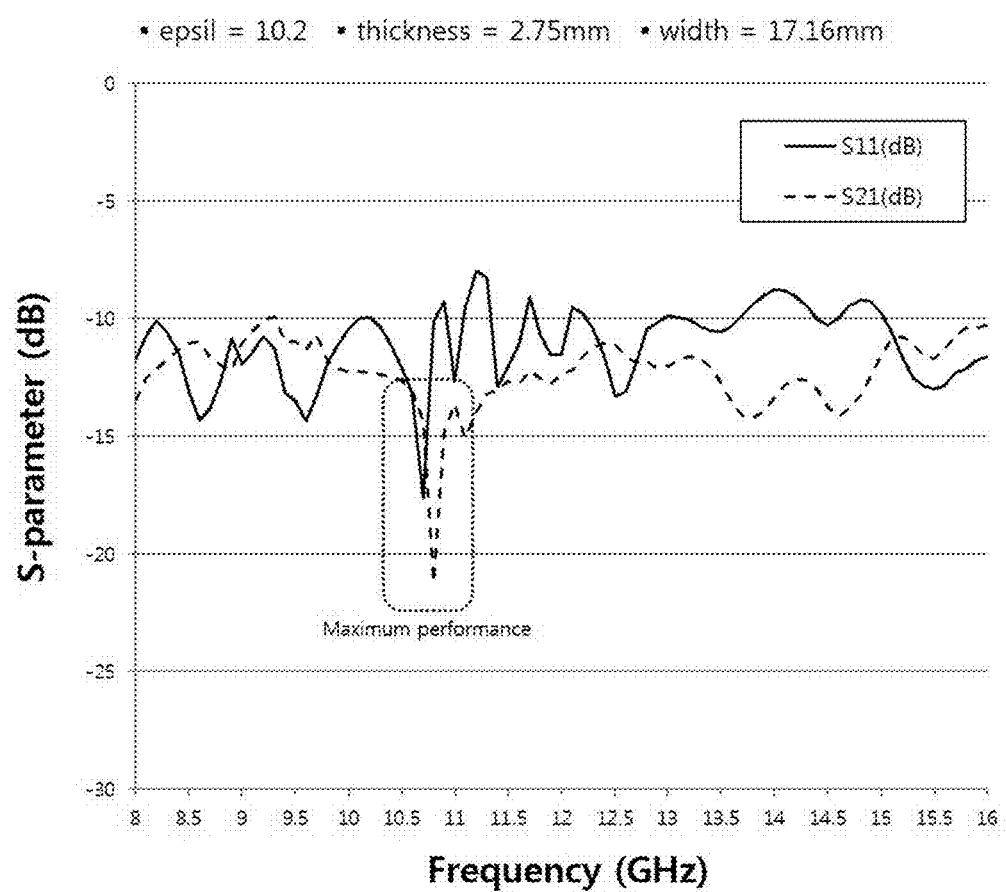
Figure 22:
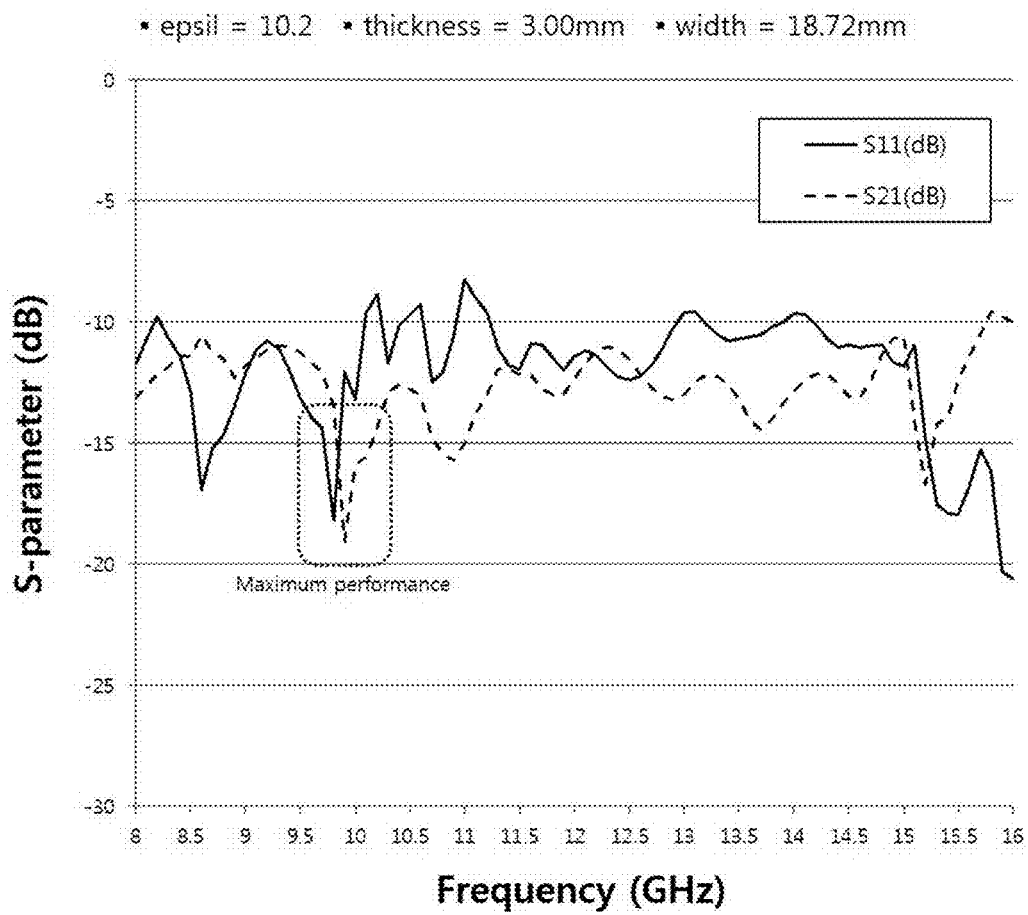
Figure 23:
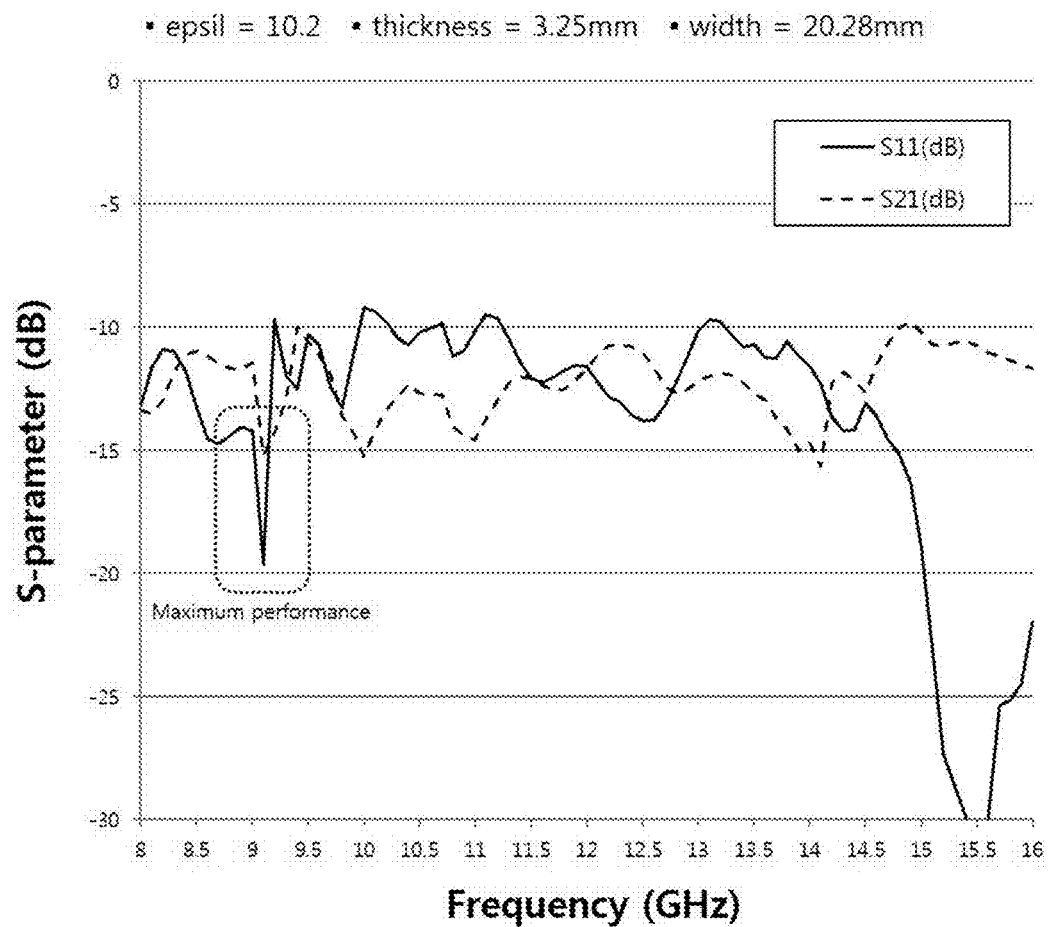

FIG. 17 depicts graphs showing the performance of the unit shielding film 200A based on changes in the thickness of the unit protrusion and depression structure according to the embodiment of the present invention. As shown in FIG. 17, the thickness of the unit shielding film 200A illustrated in the embodiment of the present invention was changed in such a manner that the thickness of the lower layer was fixed to a constant value and only the thickness of the upper layer, i.e., a unit protrusion and depression structure, was changed. In this case, it can be seen that the performance was lower than that of an existing reference structure. That is, it can be seen that only the change in the thickness of the unit protrusion and depression structure has a limitation on changing the performance of the electromagnetic wave shielding dielectric film according to the embodiment of the present invention.

FIGS. 18 to 23 are graphs showing frequency band distribution based on changes in the sizes (including widths, heights and thicknesses) of upper and lower layers in the unit shielding film 200A according to the embodiment of the present invention. In the embodiment of FIGS. 18 to 23, an aspect ratio, i.e., the ratio of thickness to width, was maintained at a constant value, and the results of frequency distributions in a band from about 8 to about 16 GHz were plotted while the sizes of the unit protrusion and depression structure were being changed.

As shown in FIGS. 18 to 23, it can be seen that when the size of the unit protrusion and depression structure increased, a frequency shift to a low frequency band occurred. In other words, when the size of the unit protrusion and depression structure decreased, a frequency shift to a higher frequency band occurred. This means that when the structure of the unit shielding film 200A was significantly small, electromagnetic wave shielding could be achieved in the visual and infrared light ranges.

Figure 24:
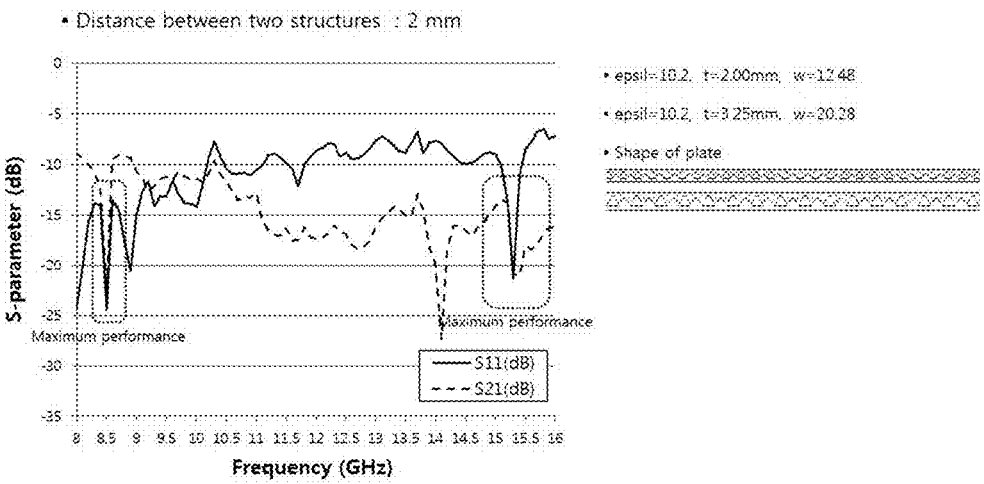
FIGS. 24 to 26 are graphs showing target frequency distributions based on changes in sizes when the sizes of the upper and lower layers are different from each other in the unit shielding film according to the embodiment of the present invention.
Figure 25:
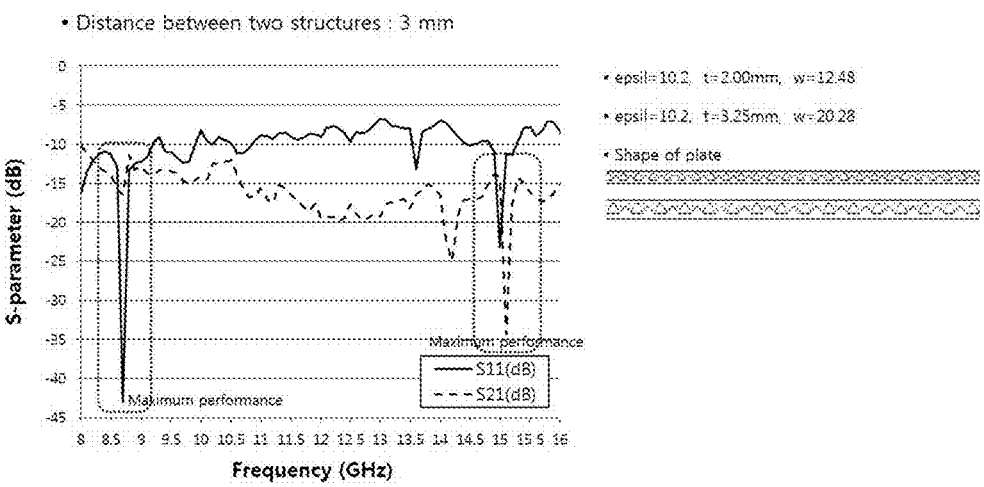
Figure 26:
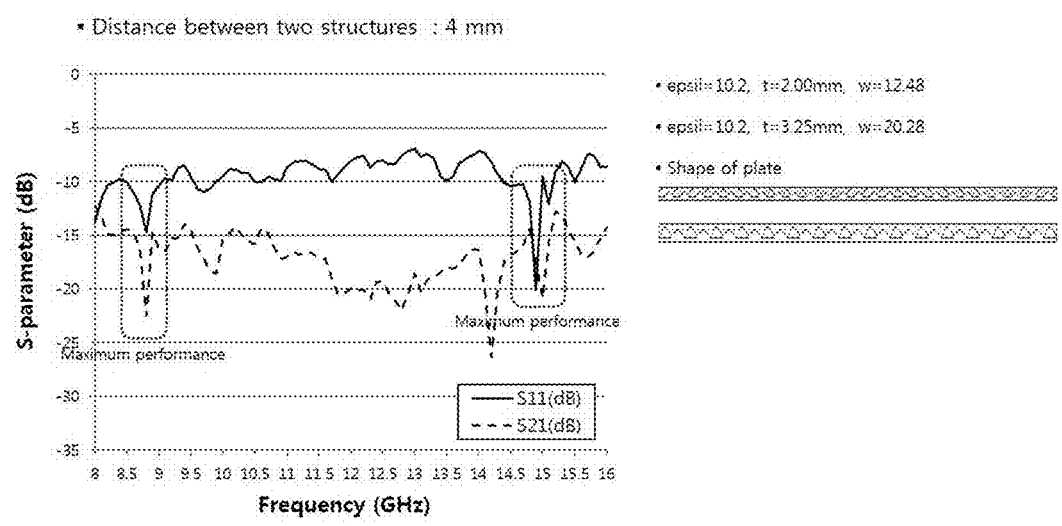

FIGS. 24 to 26 are graphs showing target frequency distributions based on changes in the sizes of upper and lower layers in the unit shielding film 200A according to an embodiment of the present invention. As shown in FIGS. 24 to 26, it can be seen that target frequencies appeared in two regions when the permittivities epsil of the upper and lower layers were fixed to the same value and a thickness t and a width w were changed.

That is, it can be seen that when two structures configured to have different sizes were combined with each other in the state in which the permittivities epsil of the upper and lower layers were fixed to the same value and the aspect ratio were maintained at a constant value, two target frequency regions (S-parameter peaks) were formed. Furthermore, it can be seen that the target frequency regions (S-parameter peaks) were generated by the structures of the upper and lower layers, respectively. This example corresponds to a case where the structures of the upper and lower layers are combined to be spaced apart from each other in order to prevent interference therebetween.

Figure 27:
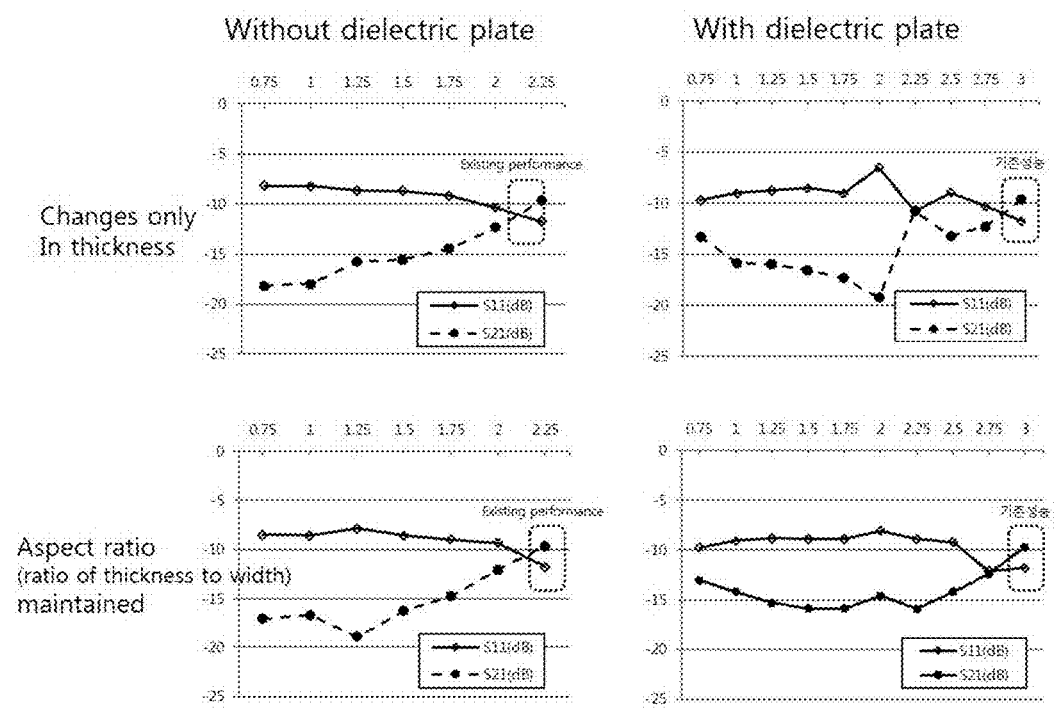
FIG. 27 depicts graphs showing performances based on changes in permittivity and changes in the thickness and width of the unit shielding film according to the embodiment of the present invention.

FIG. 27 depicts graphs showing performances based on changes in permittivity and changes in the thickness and width of the unit shielding film 200A according to the embodiment of the present invention. As shown in FIG. 27, the performances of the shielding film were measured while the thickness and the width were being changed in the state in which the permittivity had been set to about 30 considerably higher than an existing reference value of 10.2 and the aspect ratio had been maintained at an existing value.

As shown in FIG. 27, it can be seen that the performance decreased when permittivity was increased and only the thickness of the unit protrusion and depression structure was changed, and, furthermore, it can be seen that the performance decreased when the permittivity was increased, the aspect ratio was fixed to a constant value and the thickness and the width were changed.

Figure 28:
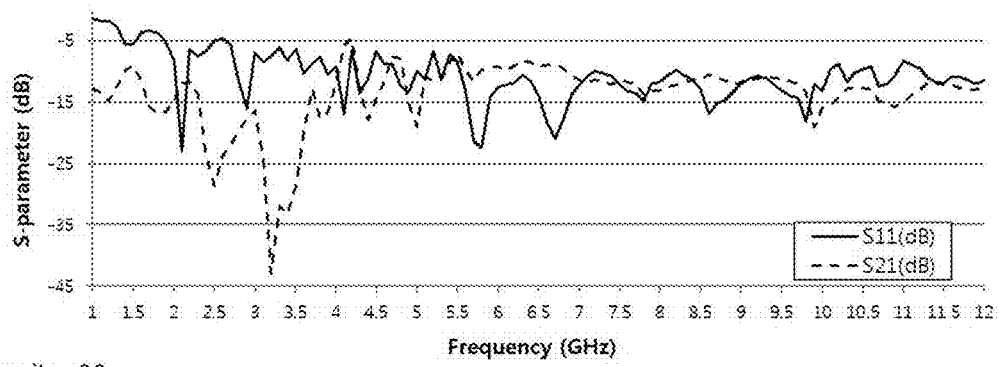
FIG. 28 depicts comparison graphs showing target frequency regions (S-parameters) when the frequency was changed for two unit shielding films including respective unit protrusion and depression structures having different permittivities.
Figure 28:
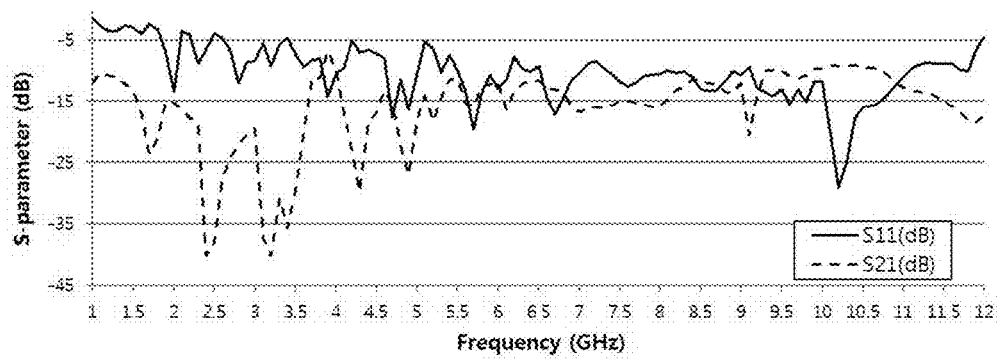

FIG. 28 shows comparative graphs showing target frequency regions (S-parameters) when the frequency was changed with respect to two unit shielding films 200A including respective unit protrusion and depression structures having different permittivities. As shown in FIG. 28, when the permittivities were set to about 10.2 and about 30, respectively, and then a frequency band from about 1 to about 12 GHz was checked, a particular frequency range shift could not be found. Accordingly, it can be seen that the frequency range shift cannot be easily obtained only by a change in permittivity. This means that a structural change has a higher influence on the setting of a target frequency than a change in permittivity.

The electromagnetic wave shielding dielectric film according to the present invention has the following advantages:

First, the present invention provides the electromagnetic wave shielding dielectric film that offers high shielding efficiency and enables a target frequency to be easily changed and adjusted.

Second, the present invention provides the electromagnetic wave shielding dielectric film that is a semi-permanent structure compared to a conventional radar absorbing material (RAM) and, thus, is excellent in terms of management and maintenance, thereby providing an electromagnetic wave shielding dielectric film having a high benefit in cost.

Third, the electromagnetic wave shielding dielectric film according to the present invention enables a target frequency to be adjusted and shielding efficiency to be adjusted by changing a parameter and size of a structure. Accordingly, the electromagnetic wave shielding dielectric film has a wide range of applications, and can be widely used as a detection avoidance structure for a frequency band rather than a detection avoidance structure for a single frequency.

Fourth, the electromagnetic wave shielding dielectric film according to the present invention is a dielectric structure without a conductive material, thereby ensuring electrical stability, securing safe against the introduction of an excessive current such as lightning, and enabling easy application to an airplane and outdoor equipment.

The embodiments described herein and the accompanying drawings merely illustrate part of the technical spirit of the present invention. Accordingly, the embodiments disclosed herein are not intended to limit the technical spirit of the present invention, but is intended to illustrate the technical spirit of the present invention. Therefore, it will be apparent that the scope of the technical spirit of the present invention is not limited by the embodiments. All modifications and variations that can be easily derived by those skilled in the art within the scope of the technical spirit of the present invention included in the specification and the diagrams should be interpreted as falling within the range of the rights of the present invention.

What is claimed is:
1. An electromagnetic wave shielding dielectric film, comprising:

a lower layer formed of a dielectric in a plate shape; and
an upper layer formed of a dielectric stacked on the lower layer and configured to form a periodic pattern of protrusion and depression structures,
wherein the protrusion and depression structures form groove portions in a periodic pattern on upper and lower surfaces of the upper layer, and the groove portions on the upper and lower surfaces are spaced apart and alternately arranged at regular intervals,
each of the groove portions on the upper surface has a groove structure in which two groove structures successively neighbor each other, and
each of the groove portions on the lower surface has a single groove structure.

2. The electromagnetic wave shielding dielectric film of claim 1, wherein each of the groove portions on the upper and lower surfaces have a structure in which a vertical groove structure and an inclined groove structure are combined in a depth direction.

3. The electromagnetic wave shielding dielectric film of claim 2, wherein electromagnetic wave shielding efficiency is adjusted based on a separation distance between the groove portions on the upper surface and the groove portions on the lower surface.

4. The electromagnetic wave shielding dielectric film of claim 2, wherein electromagnetic wave shielding efficiency is adjusted based on a depth of the vertical groove structure of each of the groove portions on the upper and lower surfaces.

5. The electromagnetic wave shielding dielectric film of claim 2, wherein permittivities of the upper and lower layers are identical to each other.

6. The electromagnetic wave shielding dielectric film of claim 2, wherein electromagnetic wave shielding efficiency is adjusted based on a change in at least any one of widths, heights and thicknesses of the upper and/or lower layers.

7. The electromagnetic wave shielding dielectric film of claim 2, wherein a target frequency is adjusted based on a change in at least any one of widths, heights, and thicknesses of the upper and/or lower layers.

8. The electromagnetic wave shielding dielectric film of claim 2, wherein sizes, including a width, a height, and a thickness, of the upper layer are different from those of the lower layer.

9. The electromagnetic wave shielding dielectric film of claim 2, wherein a protective film is formed on an uppermost surface of the upper layer.

10. The electromagnetic wave shielding dielectric film of claim 1, wherein electromagnetic wave shielding efficiency is adjusted based on a separation distance between the groove portions on the upper surface and the groove portions on the lower surface.

11. The electromagnetic wave shielding dielectric film of claim 1, wherein the lower layer is a transmission prevention film that prevents an electromagnetic wave from being transmitted therethrough.

12. The electromagnetic wave shielding dielectric film of claim 1, wherein permittivities of the upper and lower layers are different from each other.

13. The electromagnetic wave shielding dielectric film of claim 1, wherein a protective film is formed on an uppermost surface of the upper layer.

14. An electromagnetic wave shielding dielectric film, comprising:
a first shielding film including a first lower layer formed of a dielectric in a plate shape, and a first upper layer formed of a dielectric stacked on the first lower layer and configured to form a periodic pattern of protrusion and depression structures; and a second shielding film including a second lower layer formed of a dielectric in a plate shape and stacked on the first upper layer, and a second upper layer formed of a dielectric stacked on the second lower layer and configured to form a periodic pattern of protrusion and depression structures;

wherein the electromagnetic wave shielding dielectric film has a multilayer structure in which a plurality of shielding films are stacked, the protrusion and depression structures form groove portions on upper and lower surfaces of each of the upper layers of the first and second shielding films in periodic patterns, and the groove portions on the upper and lower surfaces of each of the upper layers of the first and second shielding films are spaced apart and alternately arranged at regular intervals, each of the groove portions on an upper surface of each of the upper layers of the first and second shielding films has a groove structure in which two groove structures successively neighbor each other, and each of the groove portions on a lower surface of each of the upper layers of the first and second shielding films has a single groove structure.

15. The electromagnetic wave shielding dielectric film of claim 14, wherein each of the groove portions on the upper and lower surfaces have a structure in which a vertical groove structure and an inclined groove structure are combined in a depth direction.

16. The electromagnetic wave shielding dielectric film of claim 15, wherein electromagnetic wave shielding efficiency is adjusted based on a separation distance between the groove portions on the upper surface and the groove portions on the lower surface.

17. The electromagnetic wave shielding dielectric film of claim 15, wherein electromagnetic wave shielding efficiency is adjusted based on a depth of the vertical groove structure of each of the groove portions on the upper and lower surfaces.

18. The electromagnetic wave shielding dielectric film of claim 15, wherein a protective film is formed on an uppermost surface of the electromagnetic wave shielding dielectric film.

19. The electromagnetic wave shielding dielectric film of claim 14, wherein electromagnetic wave shielding efficiency is adjusted based on a separation distance between the groove portions on the upper surface and the groove portions on the lower surface.

20. The electromagnetic wave shielding dielectric film of claim 14, wherein permittivities of the first and second shielding films are different from each other.

21. The electromagnetic wave shielding dielectric film of claim 20, wherein the permittivity of the first shielding film is higher than the permittivity of the second shielding film.

22. The electromagnetic wave shielding dielectric film of claim 14, wherein a protective film is formed on an uppermost surface of the electromagnetic wave shielding dielectric film.

* * * * *